US010546610B2

(12) United States Patent
Leonard

(10) Patent No.: US 10,546,610 B2
(45) Date of Patent: Jan. 28, 2020

(54) SYSTEMS AND METHODS FOR DYNAMIC AUDIO PROCESSING

(71) Applicant: Colin Leonard, Marietta, GA (US)

(72) Inventor: Colin Leonard, Marietta, GA (US)

(*) Notice: Subject to any disclaimer, the term of this patent is extended or adjusted under 35 U.S.C. 154(b) by 0 days.

(21) Appl. No.: 16/016,282

(22) Filed: Jun. 22, 2018

(65) Prior Publication Data

US 2018/0308518 A1 Oct. 25, 2018

Related U.S. Application Data

(63) Continuation-in-part of application No. 15/257,642, filed on Sep. 6, 2016, and a continuation-in-part of
(Continued)

(51) Int. Cl.
| | | |
|---|---|---|
| *G11B 27/00* | (2006.01) | |
| *G11B 27/031* | (2006.01) | |
| *H03G 5/02* | (2006.01) | |
| *G06F 3/16* | (2006.01) | |
| *G11B 20/10* | (2006.01) | |

(Continued)

(52) U.S. Cl.
CPC ............ *G11B 27/005* (2013.01); *G06F 3/162* (2013.01); *G06F 3/165* (2013.01); *G11B 20/10018* (2013.01); *G11B 27/031* (2013.01); *H03G 5/02* (2013.01); *G10L 21/04* (2013.01); *G10L 21/043* (2013.01); *H03G 3/002* (2013.01); *H03G 3/02* (2013.01); *H03G 7/002* (2013.01); *H03G 7/007* (2013.01); *H04R 3/04* (2013.01); *H04R 27/00* (2013.01); *H04R 2227/003* (2013.01); *H04R 2430/01* (2013.01)

(58) Field of Classification Search
CPC ....... G06F 3/162; G10L 21/04; G10L 21/043; G11B 20/10018; G11B 20/10046; G11B 27/005; G11B 27/031; H03G 3/001; H03G 3/003; H03G 5/02; H03G 7/002; H03G 7/007; H03G 7/008; H04L 65/4069; H04L 65/4092; H04L 65/601
USPC ........ 700/94; 704/503, 500; 381/98; 360/26, 360/51, 73.01, 73.02; 710/60
See application file for complete search history.

(56) References Cited

U.S. PATENT DOCUMENTS 4,275,268 A 6/1981 Takahashi
4,277,796 A 7/1981 Ross
(Continued)

OTHER PUBLICATIONS

Houghton, Matt, "Hardware in the Software Studio—Hybrid Systems", May 2010, Sound on Sound, all pages. (Year: 2010).*
(Continued)

*Primary Examiner* — Jesse A Elbin
(74) *Attorney, Agent, or Firm* — Philip H. Burrus, IV

(57) ABSTRACT

An audio processing system includes a server complex in communication with a network. The server complex receives a digital audio file and one or more analog domain control settings from a client device across the network. A digital-to-analog converter converts the digital audio file to an analog signal. One or more analog signal processors apply at least one analog modification to the analog signal in accordance with the one or more analog domain control settings. An analog-to-digital converter converts the modified analog signal to a modified digital audio file. The server complex can then deliver the modified digital audio file to the client device across the network.

20 Claims, 15 Drawing Sheets

Related U.S. Application Data application No. 15/188,795, filed on Jun. 21, 2016, now Pat. No. 10,068,611, which is a continuation of application No. 14/224,009, filed on Mar. 24, 2014, now Pat. No. 9,449,082, which is a continuation of application No. 13/209,368, filed on Aug. 13, 2011, now Pat. No. 8,682,462.

(51) Int. Cl.
| | | |
|---|---|---|
| *H03G 3/00* | (2006.01) | |
| *H04R 3/04* | (2006.01) | |
| *G10L 21/043* | (2013.01) | |
| *G10L 21/04* | (2013.01) | |
| *H03G 3/02* | (2006.01) | |
| *H03G 7/00* | (2006.01) | |
| *H04R 27/00* | (2006.01) | |

(56) References Cited

U.S. PATENT DOCUMENTS

| | | | |
|---|---|---|---|
| 4,410,917 A | 10/1983 | Newdoll | |
| 4,462,050 A | 7/1984 | Cox | |
| 5,325,238 A | 6/1994 | Stebbings et al. | |
| 6,584,443 B1 * | 6/2003 | Kawamura | H04B 14/04 |
| | | | 704/500 |
| 7,392,101 B2 | 6/2008 | Fujita et al. | |
| 8,682,462 B2 | 3/2014 | Leonard | |
| 8,886,344 B2 * | 11/2014 | Radford | H04H 60/04 |
| | | | 700/94 |
| 9,264,835 B2 | 2/2016 | Condit et al. | |
| 9,449,082 B2 | 9/2016 | Leonard | |
| 2006/0152398 A1 * | 7/2006 | Jubien | G06F 3/16 |
| | | | 341/155 |
| 2016/0336911 A1 | 11/2016 | Leonard | |
| 2017/0269898 A1 | 9/2017 | Barrett | |

OTHER PUBLICATIONS

Solid State Logic, "SL 9000J Series Total Studio System Console Operator's Manual and Computer Operator's Manual", 1994, Solid State Logic Limited, pp. 2-27 and 5-1 (Year: 1994).*

Jackson, Roger, "Apple Logic: Back to Basics—Logic Notes", Dec. 2010, Sound on Sound, all pages. (Year: 2010).*

Sage Audio, "Professional Online Mastering Mixing", Nov. 30, 2010, Sage Audio, all pages. (Year: 2010).*

Elbin, Jesse , "NonFinal OA", U.S. Appl. No. 14/224,009, filed Mar. 24, 2014; dated Nov. 30, 2015.

Elbin, Jesse , "NonFinal OA", U.S. Appl. No. 15/188,795, filed Jun. 21, 2016; dated Feb. 8, 2018.

Elbin, Jesse , "NonFinal OA", U.S. Appl. No. 16/016,273, filed Jun. 22, 2018; dated Apr. 12, 2019.

Elbin, Jesse , "Notice of Allowance", U.S. Appl. No. 15/188,795, filed Jun. 21, 2016; dated Jun. 14, 2018.

Saunders Jr, Joseph , "NonFinal OA", U.S. Appl. No. 15/257,642, filed Sep. 6, 2016; dated Dec. 29, 2017.

Saunders, Jr., Joseph , "Final Office Action", U.S. Appl. No. 15/257,642, filed Sep. 6, 2016; dated May 10, 2018.

Elbin, Jesse, "Final Office Action", U.S. Appl. No. 16/016,273; filed Jun. 22, 2018; mailed Aug. 21, 2019.

* cited by examiner

SYSTEMS AND METHODS FOR DYNAMIC AUDIO PROCESSING

CROSS REFERENCE TO PRIOR APPLICATIONS

This application is a continuation-in-part of, and therefore claims priority under 35 USC § 120 to, U.S. application Ser. No. 15/188,795, filed Jun. 21, 2016, which is a continuation of, and therefore claims priority under 35 USC § 120 to, U.S. application Ser. No. 14/224,009, filed Mar. 24, 2014, which is a continuation of, and therefore claims priority under 35 USC § 120 to, U.S. application Ser. No. 13/209,368, filed Aug. 13, 2011, now U.S. Pat. No. 8,682,462, each of which is incorporated by reference for all purposes. This application is also a continuation-in-part of, and therefore claims priority under 35 USC § 120 to, U.S. application Ser. No. 15/257,652, filed Sep. 6, 2016, which is incorporated by reference for all purposes.

BACKGROUND

Technical Field

The embodiments relate generally to systems and methods for processing audio, and, more specifically, to systems and methods for processing audio for increased perceived loudness while retaining changes in perceived volume.

Background Art

Audio production can include the pre-recording processing, recording, mixing, and/or mastering of sound. These phases of audio production can all involve processing of audio, which includes the manipulation of the audio to produce an improved digital audio file.

During audio processing, a representation of audio can be manipulated (e.g., enhanced) as either a digital or analog signal. A digital signal (i.e., digital audio) comprises a series of ones and zeros that represent a sound wave (i.e., audio). An analog signal (i.e., analog audio) comprises a continuous electrical signal that represents the sound wave. Digital manipulation (i.e., modulation) involves processing the ones and zeros of the digital signal, such as via a processor executing a formula. Analog manipulation (i.e., modulation) involves passing the analog signal through one or more physical components, such a circuit containing resistors, capacitors, op amps, and/or a vacuum tube. Whereas an analog compressor is made up of physical components, a digital compressor can be a set of instructions executed by a processor, such as a plug-in that operates within a digital audio workstation (DAW).

Typically, the audio that needs processing is one or more digital audio files. For example, a user may select one or more .WAV files representing songs that need processing. While the audio processing may take place entirely in the digital domain, the digital audio is commonly converted to analog audio and manipulated with analog audio components in most commercial audio production environments. This is the case, in part, because of the pleasing audio qualities that analog components can add to the audio. However, in environments where cost is a factor, some or all of the audio production process may be carried out digitally through the use of plugins and software, some of which may attempt to model the characteristics of physical analog equipment.

For example, the recording process involves recording sound in the digital domain in the form of digital audio files. Often, some processing, such as pre-mixing, of these files will occur in order to add some clarity or change the levels of the recorded audio, and to determine whether additional takes are necessary.

Similarly, the mixing process can involve processing audio by raising or lowering levels for particular tracks, adding effects, adding equalization, adding compression, and so forth, in order to create a clearer sounding audio production.

As another example, the mastering process involves enhancing recorded audio from a source, such as a compact disc (CD) containing a final mix of the recorded audio, to create a master version of the audio with improved sound translation and increased loudness for the best possible playback on various sound systems. The enhancement almost always includes modifying the audio by applying some form of compression, limiting, and/or equalization to the audio.

The end goal of the mastering process is typically to create a master version of the enhanced audio that can be used to replicate and/or distribute the audio. For example, the master audio may be stored digitally on a compact disk. Alternatively, an analog version of the master audio may be stored on tape or vinyl. In either case, the medium holding the final audio is referred to as the "master," and is generally used to replicate the audio, such as in the creation of vinyl, compact discs, digital files for download, or other music media for public use.

Mastering and mixing engineers and/or home users almost always need to apply corrective equalization and/or dynamics processing (e.g., compression and/or limiting) in order to improve upon sound translation on all playback systems and increase loudness. When processing audio, dynamics processing (e.g., dynamic compression or limiting) is used to increase the volume of the recorded audio to two or three times the original volume so that the volume level can be competitive with that of other music in the market for sale. Achieving competitive volume levels is important so that the mastered song is not perceived as quieter and/or less energetic than other songs played on a listener's sound system. However, this type of dynamic enhancement usually flattens the volume levels and dynamic changes in the audio, removing fluctuation in dynamics (loud parts vs. quiet parts) so that the listener is less able to distinguish volume changes in the music and the impact of dynamic instruments like drums. This type of compression and limiting is very common and the increases in levels can also cause audible distortion in the music.

Similar techniques are used, for example, to ensure that commercials are loud enough to stand out and catch the attention of viewers. Additionally, mixing engineers for television and movies process sounds, voices, music, etc. in order to achieve levels and clarity that is appropriate for the particular application.

In addition to audio professionals (e.g., mastering engineers, mixers, mixers for film (television and movie audio), audio engineers, audio producers, recording studio engineers, studio musicians, etc.), home enthusiasts and hobbyists may also be involved with various aspects of audio production. For example, some people record, mix, remix, master, and/or otherwise produce audio, such as music, as a hobby. Other people are stereo enthusiasts (e.g., audiophiles) who use hardware and/or software to process "finished" audio to achieve a better listening experience. Production of audio at nearly any level involves some form of audio processing. However, these hobbyists and at-home enthusiasts are often limited by their lack of training and the expense required to purchase professional-level equipment for achieving commercial-level loudness without destroying dynamics and/or introducing distortion.

Therefore, a need exists for systems and methods of processing audio that can achieve commercially competitive audio levels without destroying the dynamics (i.e., perceived volume changes) of the song or causing distortion in the audio.

Accordingly, systems and methods are provided herein for processing audio to bring the volume levels up to today's very loud digital levels (or louder) while reducing distortion and retaining more volume dynamics (i.e., perceived changes in volume) than prior systems have ever allowed in the past.

BRIEF DESCRIPTION OF THE DRAWINGS

The accompanying drawings, which are incorporated in and constitute a part of this disclosure, illustrate various embodiments and aspects of the present invention. In the drawings.

DETAILED DESCRIPTION OF THE DRAWINGS

Figure 1A:
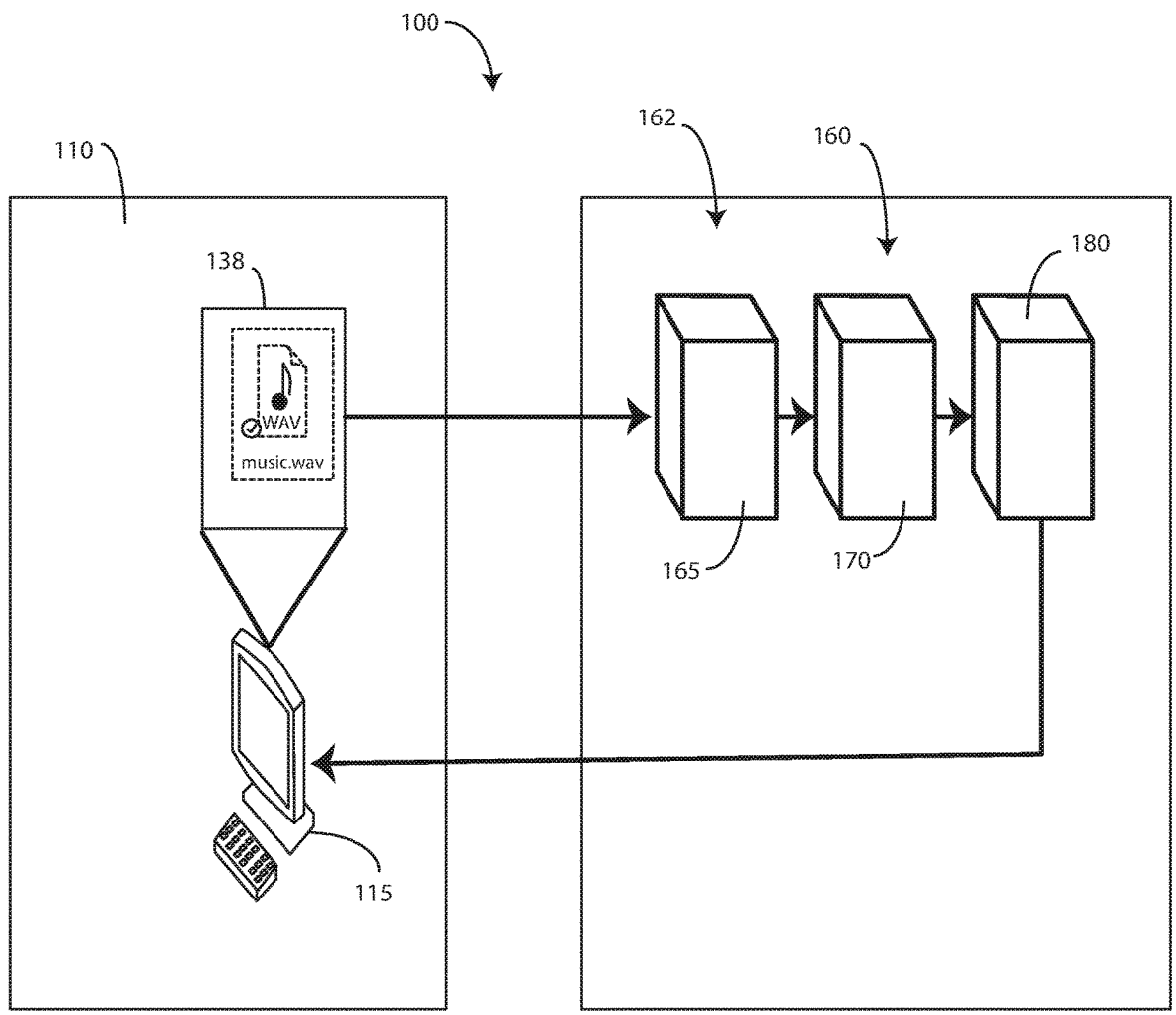
FIG. 1A is an exemplary illustration of a system for processing audio, in accordance with an embodiment.

Before describing in detail embodiments that are in accordance with the present disclosure, it should be observed that the embodiments reside primarily in combinations of method steps and apparatus components related to controlling, remotely, analog signal processors in an automated analog domain mastering system to master a digital audio file in the analog domain. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, it is expected that one of ordinary skill, notwithstanding possibly significant effort and many design choices motivated by, for example, available time, current technology, and economic considerations, when guided by the concepts and principles disclosed herein will be readily capable of generating systems and methods in accordance with the disclosure with minimal experimentation.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to analog signal processing circuits operating in tandem with a server complex, allow digital control of analog domain equipment to master digital audio files in the analog domain remotely to obtain a final mix.

Embodiments described herein include systems and methods for processing audio. In one embodiment the, system comprises a processor that plays a digital audio file. The digital audio file may contain metadata specifying a first clock frequency for normal playback. However, the processor plays the digital audio file at a second clock frequency that is higher than the first (i.e., normal) clock frequency, resulting in faster than normal playback.

In one embodiment, a digital-to-analog converter converts the digital audio into an analog signal (representing analog audio) while the digital audio is playing at the higher second clock frequency (i.e., faster than normal). This may raise the low frequency information to become higher frequency information of the digital audio file during playback, as compared to playback at the first clock frequency. The system may then pass the converted analog signal through an analog circuit to manipulate at least one sound characteristic of the analog audio. For example, the analog circuit may contain components for compressing, limiting, and/or making equalization adjustments to the analog audio.

Upon passing through the analog circuit, the system may route the manipulated analog signal to an analog-to-digital converter. The analog-to-digital converter may then convert the manipulated analog signal into a manipulated digital audio file, which is stored on a computer-readable storage medium. The processor then changes the clock frequency associated with the modified digital audio file back to the first (i.e., original and normal) clock frequency, for normal playback. This can lower the frequency range of the modified digital audio file to frequencies representative of the original digital audio file (aside from adjustments made using, for example, equalization during processing).

In one embodiment, the audio processing is carried out across multiple workstations and/or processors. For example, a first workstation may output the digital audio file to an analog circuit, which in turn outputs to a second workstation that converts the analog audio into a modified digital audio file. This may be thought of as a "throw and catch" arrangement.

In another embodiment, the system includes a monitoring circuit that converts a segment of the modified analog audio into a preview segment of digital audio that is played back for monitoring at the first clock frequency prior to the creation of the entire modified digital audio file.

In another embodiment, the manipulation of the digital audio file occurs entirely within the digital domain.

It is to be understood that both the foregoing general description and the following detailed description are exemplary and explanatory only and are not restrictive of the embodiments, as claimed.

Reference will now be made in detail to the present exemplary embodiments, including examples illustrated in the accompanying drawings. Wherever possible, the same reference numbers will be used throughout the drawings to refer to the same or like parts.

During audio processing, a representation of audio can be manipulated, altered, or enhanced either in the digital domain or in the analog domain. A digital signal suitable for processing in the digital domain, one example of which is a digital audio file, comprises a series of ones and zeros that can be converted into an analog sound wave defining aural audio. By contrast, an analog signal suitable for processing in the analog domain comprises a time-varying electrical signal that can drive a driver, such as a loud speaker, to create an analog sound wave.

Manipulation in the digital domain involves processing the ones and zeros of a digital signal. By contrast, manipulation in the analog domain involves passing the analog signal through one or more analog signal processors. Such processing components can include resistors, capacitors, inductors, operational amplifier, vacuum tubes, transistors, and other analog components. Whereas analog signal processors comprise physical components, a digital signal processors can be reduced a set of instructions executed by a processor, such as a plug-in that operates within a digital audio workstation.

Modern recording studios frequently record audio in the digital domain. While some studios still use analog devices such as audio tapes, most studios employ digital recording devices because storage, transmission, copying, and sharing a digital recording is far simpler than with an audio tape. Illustrating by example, a studio may record a recording in the digital domain and save it as a .WAV file. After the recording, the .WAV file will need to be mastered.

Mastering can take place entirely in the digital domain. For example, in environments where cost is a factor, some or all of the audio production process may be carried out digitally through the use of plugins and software, some of which may attempt to model the characteristics of physical analog equipment. However, as noted above, many artists, audiophiles, and purists prefer mastering in the analog domain due to the superior acoustic characteristics that result in the final mix. To accomplish audio mastering from a digital file, the digital audio must be converted to analog audio and manipulated with analog audio components. Analog mastering provides a more pleasing and rich sound due to the way that audio signal processors raise or lower levels for particular tracks, add effects, add equalization, add compression, and so forth to manipulate audio signals. The end goal of the mastering process is to create a master version of the enhanced audio that can be used to replicate and/or distribute the audio.

Mastering and mixing engineers and/or home users almost always need to apply corrective equalization and/or dynamics processing such as compression and/or limiting to improve sound translation and loudness to ensure proper fidelity on all playback systems. When processing audio, dynamics processing, e.g., dynamic compression or limiting, is used to increase the volume of the recorded audio to two or three times the original volume so that the volume level can be competitive with that of other music in the market for sale. Achieving competitive volume levels is important so that the mastered song is not perceived as quieter and/or less energetic than other songs played on a listener's sound system. However, this type of dynamic enhancement usually flattens the volume levels and dynamic changes in the audio, removing fluctuation in dynamics (loud parts vs. quiet parts) so that the listener is less able to distinguish volume changes in the music and the impact of dynamic instruments like drums. This type of compression and limiting is very common and the increases in levels can also cause audible distortion in the music.

In addition to audio professionals such as mastering engineers, mixers, mixers for film, audio engineers, audio producers, recording studio engineers, studio musicians, home enthusiasts, and hobbyists frequently have a need for mastering services. Illustrating by example, some people record, mix, remix, master, and/or otherwise produce audio, such as music, as a hobby. Other people are stereo enthusiasts or audiophiles who use hardware and/or software to digitally process "finished" audio to achieve a better listening experience. However, these hobbyists and at-home enthusiasts are often limited by their lack of training and the expense required to purchase professional-level analog equipment for achieving commercial-level loudness without destroying dynamics and/or introducing distortion.

Advantageously, embodiments of the disclosure provide a remote system by which users may not only master files in the analog domain, but also control the analog boards and analog signal processors to make adjustments in accordance with their desired preferences. In short, embodiments of the disclosure allow users to remotely access the expensive and complex analog signal processing devices of an analog master's highly controlled studio, and in particular, to control those analog signal processing devices to master content from a computer, tablet, or phone without having to travel to the studio.

Embodiments of the disclosure allow remote, analog, audio mastering from a client device that is interfaced across a network with a server complex. A user employing a user interface at a client terminal can provide one or more analog domain control settings from the client terminal to control settings and other adjustments on one or more analog signal processors located across the network to master files in the analog domain. Using embodiments of the disclosure, a user can change the settings on analog—as well as digital—equipment remotely. Parameters such as input level, output level, equalization, compression, and other settings of analog or digital equipment can be adjusted using the client device, which is located remotely from the server complex and analog signal processing equipment.

Exemplary embodiments herein allow a user to create audio files that can be perceived as louder, more dynamic, and/or less distorted than audio files created using traditional methods. In one embodiment, a digital audio file is assigned a clock frequency (i.e., second clock frequency) that is higher than the normal playback frequency (i.e., first clock frequency). Then the digital audio file may be played at the higher clock frequency (resulting in a faster playing speed and higher frequency information in the audio). In one embodiment, the digital audio file playing at the second frequency may then be converted to an analog signal and processed using one or more analog equalizers and/or analog dynamics processors (e.g., compressor, limiter, etc.) (i.e., an analog circuit). The analog audio signal (playing at the faster speed) may then be converted to digital by an analog-to-digital converter. In the digital domain, further processing can be applied in one embodiment. The resulting modified digital audio file may be saved to a non-transitory computer-readable medium, where the clock frequency of the resulting digital audio file is reset to the original normal playback frequency so that the modified digital audio file can be played at its original speed.

By processing the digital audio file while it plays at the higher frequency, less low frequencies are present in the digital audio file (and more high frequency information is present), and distortion attributable to passing low frequencies through digital-to-analog converters, compressors, limiters, equalizers, and/or other components may be reduced. This results in increased capability to make the audio louder, which in turn can result in a louder, clearer, and more dynamic audio file. Additionally, the faster playback speed can allow for faster audio processing when the entire analog audio signal must be converted back into and stored as a modified digital audio file.

Consequently, an embodiment herein may help users (e.g., mastering engineers, television or film mixers (mixing for film), home stereo enthusiasts (audiophiles), and/or anyone else who processes audio) create audio files with a competitive volume without distortion or diminished dynamics. For example, an embodiment also may help recording studios create listening versions of clients' recordings at a competitive volume so that the recording may be much louder but not distorted. As another example, a further embodiment may allow 'at home' studio engineers to create competitive and quality sounding recordings without spending money on a mastering engineer. Because an embodiment may allow for processing audio to contain higher volume levels with minimal difficulty, this may allow hobbyists and at-home enthusiasts a means of creating commercially-acceptable productions with reduced costs and/or training.

The methods disclosed herein may be executed in full or in part, for example, by a processor that executes instructions stored on a non-transitory computer-readable storage medium. Similarly, a system described herein may include a processor and a memory, the memory being a non-transitory computer-readable storage medium. As used herein, a non-transitory computer-readable storage medium refers to any type of physical memory on which information or data readable by a processor may be stored. Examples include random access memory (RAM), read-only memory (ROM), volatile memory, nonvolatile memory, hard drives, solid state drives, CD ROMs, DVDs, flash drives, disks, and any other known physical storage medium.

Additionally, singular terms, such as "processor," "memory," and "computer-readable storage medium," may additionally refer to multiple structures, such a plurality of processors, memories, and/or computer-readable storage mediums. The same applies to the term computer, which is understood to contain at least one processor that is communicatively coupled to at least one memory.

As referred to herein, a "memory" may comprise any type of computer-readable storage medium unless otherwise specified. A computer-readable storage medium may store instructions for execution by a processor, including instructions for causing the processor to perform steps or stages consistent with an embodiment herein. Additionally, one or more computer-readable storage mediums may be utilized in implementing a computer-implemented method. The term "computer-readable storage medium" should be understood to exclude carrier waves and transitory signals.

Additionally, although "mastering" may be used as an example throughout, it is understood that the following description applies to other forms of audio production and/or audio processing, such as mixing, recording, pre-recording, and other forms of post-production.

In one or more embodiments, a server complex is in communication with a network, such as the Internet. A remote device, which may be a computer, a tablet, a smartphone, or other device, receives a user interface presentation from the server complex. The user interface can include one or more analog domain control settings, one or more digital domain control settings, and a network upload portal. Using the user interface, the user can set the analog domain control settings and/or digital domain control settings to the desired level. Additionally, the user can upload a digital audio file through the network upload portal.

The server complex, which is in communication with the remote device across the network, then receives the digital audio file, the one or more analog domain control settings and/or the one or more digital domain control settings. Using analog signal processing as an example, the server complex then employs a digital-to-analog converter to convert the digital audio file to an analog signal. A control device, which is operable with one or more analog signal processors, then applies setting adjustments to the one or more analog signal processors in accordance with the one or more analog domain control settings received from the remote device.

The one or more analog signal processors then apply at least one dynamic analog modification to the analog signal. As the analog signal processors have been configured in accordance with the one or more control signals, the at least one dynamic analog modification is applied in accordance with the one or more analog domain control settings received from the remote device. The application of the one or more dynamic analog modifications results in a conversion of the analog signal to a modified analog signal. An analog-to-digital converter then converts the modified analog signal to a modified digital audio file.

The server complex can then share the modified digital audio file with the user. For example, in one embodiment the server delivers a download portal, which facilitates download of the modified digital audio file to the remote device across the network. Advantageously, the user need never visit the studio or physically touch the analog signal processors to control them as desired to master audio files in the analog domain.

Embodiments of the disclosure use various systems and methods for processing audio. In one embodiment, a system comprises a processor of a server complex that plays a digital audio file. In one embodiment, a digital-to-analog converter converts the digital audio into an analog signal (representing analog audio) while the digital audio is playing.

The digital audio file may contain metadata specifying a first clock frequency for normal playback. In some embodiments, while playing the digital audio file, the processor may optionally play the digital audio file at a second clock frequency that is different from, i.e., higher or lower, than the first, i.e., normal, clock frequency. This results in faster than normal playback, and as will be described in more detail below, can be used to further augment the mastering process. However, it should be noted that this adjustment of frequency is optional and in many embodiments will be omitted. Where frequency adjustment is optionally used, it may raise the low frequency information to become higher frequency information of the digital audio file during playback, as compared to playback at the first clock frequency.

Regardless of whether clock frequency adjustment is employed, in one or more embodiments the system then passes the analog signal through one or more analog signal processors to manipulate at least one sound characteristic of the analog audio. For example, the one or more analog signal processors may contain components for compressing, limiting, and/or making equalization adjustments to the analog audio.

In one or more embodiments, a mixing console or other settings controller is operable to control the one or more analog signal processors. The mixing console includes potentiometers and other controls for combining, routing, and altering analog signals. The mixing console can adjust settings of the one or more analog signal processors to change the volume level of the analog signal, the timber of the analog signal, or the dynamics of the analog signal. The mixing console can also adjust the settings of the one or more analog signal processors to combine or split the analog signals, such as from or to different tracks, as well. The mixing console can control the one or more analog signal processors to modify analog signals with one or more of compression, limiting, or equalization.

In one or more embodiments a control device, which can be any of a robotic arm, one or more digitally controlled relays, one or more voltage controlled filters, one or more digitally controlled servo-driven potentiometers, one or more digitally controlled servo-driven attenuators, one or more digitally controlled voltage controlled amplifiers, one or more digitally controlled variable gain amplifiers, or combinations thereof, are operable to apply received analog domain control settings to the mixing console. For example, if a user uploading a song into a web portal wants increased compression, they can indicate this by transmitting analog domain control settings to the server complex. Where the control device is a robotic arm, the robotic arm can adjust the knobs, sliders, and/or potentiometers to apply the increased compression settings to the analog signal processors. Advantageously, this allows the user to control the mixing console and its corresponding analog equipment remotely.

Upon passing through the analog circuit, the system may route the manipulated analog signal to an analog-to-digital converter. The analog-to-digital converter may then convert the manipulated analog signal into a manipulated digital audio file, which is stored on a computer-readable storage medium. Where the optional clock frequency modification described above was included, the processor may then change the clock frequency associated with the modified digital audio file back to the first, i.e., original and normal, clock frequency, for normal playback. Where employed, this can lower the frequency range of the modified digital audio file to frequencies representative of the original digital audio file. However, as noted above, clock frequency adjustment is optional and will not be included in one or more embodiments.

In one or more embodiments, the audio processing is carried out across multiple workstations and/or processors. For example, a server complex may include a first workstation to output the digital audio file to the one or more analog signal processors, which in turn outputs an analog signal modified in accordance with received analog domain control parameters to a second workstation. The second workstation may then convert the modified analog signal into a modified digital audio file. This may be thought of as a "pitch and catch" arrangement. In other embodiments, the server complex may be simpler in structure. For example, rather than having two workstations, a single workstation may include multiple outputs and/or inputs to convert a digital file to an analog signal, deliver the analog signal to the one or more analog signal processors, and then receive the modified analog signal back from the analog signal processors. Other configurations of the server complex will be obvious to those of ordinary skill in the art having the benefit of this disclosure. It is to be understood that both the foregoing general description and the following detailed description are exemplary and explanatory only and are not restrictive of the embodiments, as claimed.

FIG. 1A is an exemplary illustration of a system 100 for processing audio, in accordance with an embodiment. In this example, the components of the system are split into the digital domain 110 and analog domain 160.

In particular, the system 100 may include a computer (e.g., workstation) 115 that stores a digital audio file 138. The computer may comprise one or more computers (e.g., workstations). A workstation (e.g., digital audio workstation (DAW)) can comprise at least one processor and a computer readable storage medium. In one embodiment, the workstation is a stand-alone device built specifically for handling audio production, mixing, and/or processing. For example, the workstation may have an integrated mixer, audio sequencer, and/or effects capabilities. In another embodiment, the workstation can comprise a personal computer with software being executed by a processor for the purpose of audio production, recording, mixing, and/or mastering.

In one embodiment, the digital audio file 138 is stored when the computer 115 records the digital audio file (e.g., in a recording environment). In another embodiment, the computer 115 may simply import and store a previously-recorded digital audio file 138. For example, at a mastering studio, a client may bring a CD containing the digital audio file 138, which is then accessed by computer 115. Alternatively, the client may provide a link for downloading the digital audio file 138 onto computer 115, such as by sharing a cloud-computing folder containing the digital audio file 138.

The digital audio file 138, as discussed herein, may include any file format that contains a representation of audio, such as .WAV, .AIFF, .MP3, SDII, AC3, DSD, or any number of audio file formats. For example, the digital audio file 138 shown in FIG. 1A is a .WAV file, which is compatible with the Windows™ operating system and typically contains non-compressed audio information (i.e., a relatively large file that contains all recorded audio information). However, other file types are possible. For example, the digital audio file 138 can even include a video file type, such as .AVI, to the extent that the video file type includes an audio track or portion.

The digital audio file 138 may also contain metadata that specifies characteristics of the digital audio file 138, such as the bit rate and the sample rate. Other characteristics can also be identified in the metadata. For example, .WAV files contain a header that can indicate surround sound and speaker positions, provide information regarding sample types, and supports defining custom extensions to the format chunk.

The sample rate may indicate the number of samples per second used in a digital representation of an analog signal. The bit rate may indicate the number of bits used to represent the level of the sample. In theory, the higher the sample rate and bit rate, the closer a discrete digital audio file represents the continuous analog audio signal that it emulates.

The normal playback or recording frequency (sample rate) can vary between different digital audio files. The playback frequency is the sample rate indicated by the metadata, in an embodiment. For example, the standard sample rate (i.e., normal playback frequency) used for digital audio files on audio compact discs (e.g., music CDs) is 44,100 samples per second (44.1 kHz), with 16 bits of information per sample. Digital Video Discs (DVDs), on the other hand, contain digital audio files with a sample rate of 48 kHz and 24 bits of information per sample.

For example, to playback a digital audio file recorded at 44.1 kHz, the playback device will either read the metadata and automatically switch to a 44.1 kHz sample rate, or the user may have to select what sample rate the audio was recorded at, depending on the embodiment. If the wrong sample rate is selected the audio may playback at an incorrect speed. Some systems may automatically sample rate convert the digital audio if the correct sample rate is not selected in the system. This will resample the audio file so that it plays at the correct speed (maintaining the frequencies of the originally-recorded audio). Sample rate conversions generally can lead to fidelity loss and are avoided by audio professionals if possible.

Additionally, music files can be recorded at a variety of different sample rates (resulting in a variety of different normal playback frequencies). For example, some professional audio hardware provides the option for sample rates of 88.2 kHz, 96 kHz, and/or 192 kHz. Even though standard audio applications tend to call for digital audio files with 44.1 kHz or 48 kHz sample rates, higher sample rates can be useful in audio recording applications where effects are applied to ensure that the modified source information is as close to the original analog signal (e.g., the signal generated by pressure on a microphone diaphragm) as possible.

In the case of audio with a non-commercial sample rate, the sample rate can be converted to a standard sample rate (e.g., 44.1 kHz or 48 kHz) at a later time, such as when creating mixes or master versions of the audio. Converting the sample rate involves re-approximating the represented audio signal at the new sample rate, in order to preserve the frequencies and overall sound of the digital audio file. This is a different concept than changing the playback frequency of a digital audio file, which causes the digital audio file to play back faster or slower at higher or lower frequencies, respectively. Converting the sample rate instead maintains the frequency response of the audio.

In one embodiment, the digital audio file 138 may have metadata indicating a first clock frequency to use for normal playback. For example, the metadata may indicate a sample rate of 44.1 kHz. In one embodiment, the sample rate may also be the clock frequency.

In another embodiment, the sample rate can be extrapolated into a clock frequency to use for normal playback. For example, because each sample of the digital audio file contains multiple bits-worth of information, if the system ties the clock to a particular amount of data to be processed, the actual clock frequency for playback may also depend on the bit rate, which also may be indicated by metadata in the digital audio file 138. However, the sample rate indicated by metadata in many systems indicates the actual clock frequency for normal playback, eliminating the need for the processor to calculate a different clock frequency for use in playback. However, either embodiment is considered to indicate a first clock frequency for a processor to use for normal playback.

In one embodiment, the digital audio file is converted to an analog signal. The processor (e.g., of the digital audio workstation 115) facilitates playback by routing information from the digital audio file 138 at a specified playback clock frequency (e.g., sample rate). In one embodiment, the information is routed to a digital-to-analog converter by the processor. The digital-to-analog converter converts the digital signal into an analog signal (used in analog domain 160), which is ultimately supplied to speakers to produce pressure differences in the air that are perceived as sound.

In another embodiment, the processor routes the information to a digital processor module (e.g., plugin) that emulates analog hardware. This can allow for additional digital effects to be applied to the digital audio file 138 in the digital domain 110 in a way consistent with how effects are applied in real time in an analog domain 160. However, the digital audio is not audible to a listener without first being converted into an analog signal.

In one embodiment, the processor is included in computer 115 (which can include one or more computers). In another embodiment, the processor is located outside computer 115, such as in an interface or module that is communicatively coupled to computer 115.

The processor may cause the audio file 138 to play at a second clock frequency that is higher than the first clock frequency. For example, the processor may set the metadata of the digital audio file to indicate a second clock frequency for playback that is double the first clock frequency. However, other combinations are possible, such as a 25 percent higher clock frequency.

Using the second (i.e., higher) clock frequency for playback causes the digital audio file 138 to playback at a faster speed than normal. As a result, the digital file exhibits higher frequency characteristics than when played at the normal playback frequency, and also completes playback sooner. For example, by doubling the clock frequency, a digital audio file with audio information up to 22,500 Hz can have audio information up to 44,100 KHz, which is far outside the range of human hearing.

In one embodiment, the clock frequency is chosen to substantially reduce or virtually eliminate audio frequency information below 250 Hz. This low frequency information often creates a "muddy" sound and may be the cause of distortion created by digital-to-analog converters and/or analog components, such as a compressor, or digital components, such as digital audio processors. The exact clock frequency needed to raise the low frequency information above this threshold may vary depending on the source audio information. For example, if an audio file has substantial audio information at 200 Hz, a 25 percent increase in clock frequency will move that audio information to above 250 Hz. In one embodiment, the ideal clock frequency is chosen automatically by the processor, which analyzes the digital audio file to determine which clock frequency will move audible levels of audio information to above 100 Hz.

In one embodiment, a digital-to-analog converter may convert the digital audio into an analog audio signal while the digital audio is playing at the higher second clock frequency. Because the processor plays the digital audio file 138 at the higher second clock frequency, less low frequency information is passed through the converters (relative to when the digital audio file 138 is played at a higher frequency), which may reduce distortion and allow for a louder analog audio signal. Eliminating and/or reducing low frequency information lightens the load on these components (including the analog input of analog-to-digital converters, in which low-frequency information can account for significant portions of current, causing overloading and/or distortion), which can result in a clearer analog audio signal.

The audio signal, as a result, may require less compression since it is already louder. This, in turn, may also allow for maintaining dynamics in volume while still achieving commercial loudness levels. This may further lead to more clarity in the digital-to-analog conversion, since lower frequencies are often the cause of the most audible distortion during the conversion process.

The digital-to-analog converters may reside on computer 115 in one embodiment, for example, as part of a sound card. In another embodiment, the converter(s) may be located externally to computer 115.

The clock signal used to play the digital audio 138 at the higher second clock frequency may be generated by computer 115 (e.g., by the processor) in one embodiment. Alternatively, a module communicatively coupled to the computer 115 may be responsible for generating the clock signal in another embodiment. For example, a separate clock module may be used to reduce an effect called jitter by having the clock module supply the processor with a more accurate clock signal. Other modules, such as the digital-to-analog converter module, may alternatively supply the clock signal to the processor.

Although the sample rate is changed in metadata to reflect the second clock frequency in one embodiment, an alternate embodiment does not alter the metadata. Instead, the DAW 115 may notify an external converter of the playback clock frequency to use. Or the user may select the clock frequency on the device supplying the clock signal. The external converter may not check the metadata of the digital audio file, but instead will supply the clock at the frequency indicated by the DAW or user. In this embodiment, after the audio has been processed, the resulting modified digital audio file may already contain the correct metadata for sample rate. However, in one embodiment, the external converter must be notified to change the clock frequency back to the first frequency for normal playback.

In one embodiment, once the digital signal (created in the digital domain 110 during playback) is converted to an analog signal, an analog circuit 162 may apply at least one dynamic modification to the analog signal. The dynamic modifications (i.e., effects) applied may include at least one of compression, limiting, and equalization. In one embodiment, additional effects are possible, such as stereo field effects, exciter effects, tape emulation effects, etc. In order to apply these effects, the analog circuit 162 may comprise one or more hardware modules, such as modules 165, 170, and 180. The modules may comprise any known combination of circuitry and analog components for applying compression, limiting, and/or equalization, depending on the dynamic effect applied by the particular module.

Additionally, each of the modules may be connected to one another in an effects chain in one embodiment. In an effects chain, the output from one module can serve as an input for another module. For example, a compressor module 165 may output a modified analog signal that is received as an input at a limiter module 170. The output of limiter module 170 may then be received as an input of equalization module 180. In the example shown in FIG. 1A, the output of the equalization module 180 could be sent to an analog-to-digital converter so that the modified analog signal may be converted back into digital audio. Additionally, although the example in FIG. 1A illustrates a signal chain wherein compression is provided first, then limiting, and then equalization, effects may also be provided in other orders. For example, equalization may be applied before any compression in another embodiment.

In one embodiment, multiple modules of the analog circuit 162 may be part of a single hardware module (e.g., product) that is capable of applying multiple effect types.

Continuing with the example of FIG. 1A, the compressor module 165 is used to compress the dynamic range of the audio signal. This type of compression is distinct from data compression, in which the information is optimized for a smaller file size. In dynamic range compression, quiet sounds can be made louder by reducing the dynamic range of loudness and amplifying the quiet sounds.

The type of compression applied may vary between embodiments. For example, a peak sensing compressor may respond to an instantaneous level of the input signal. This type of compression may provide tighter peak control, but can yield very quick changes in gain reduction, which under traditional audio processing methods can lead to audible distortion. Alternatively, an averaging compressor may be used to apply an averaging function (such as root mean squared ("RMS")) on the input signal before its level is compared to the threshold. Some compressors may include controls or inputs to set a compression ratio, which typically determines the reduction of signal loudness, and a gain level to increase the loudness of the audio signal. Other controls, such as attack, release, and knee control may be provided to help shape the compression. The attack may determine the period when the compressor decreases gain to reach the level governed by the ratio. The release may determine the period when the compressor is increasing gain to the level governed by the ratio, or, to zero dB, once the level has fallen below the threshold. The length of each period may be determined by the rate of change and the required change in gain. In one embodiment, the attack and release times are adjustable by the user. In another embodiment, the attack and release times determined by the circuit design and cannot be adjusted by the user.

In an embodiment, providing an audio signal at a second (i.e., higher) clock frequency reduces the distortion caused by the compressor module 165. This is because less low frequencies may be presented to the compressor module 165 than if the signal had been created by playing the audio at the first clock frequency. Because lower frequencies can cause a bottle neck in compressors, restricting how much output can be attained before distortion occurs, providing a signal with less low frequency information can result in less distortion when applying compression.

Continuing with FIG. 1A, a limiter module 170 may receive a modified analog signal from compressor module 165. Limiting, as provided by the limiter module 170, is technically another form of compression that includes a very high compression ratio. For example, a compression ratio between 60:1 and .infin.:1 may be used in limiting. The purpose of limiting is generally to keep the audio signal level below 0 dB, to avoid "clipping." Audio engineers and producers typically try to avoid clipping because clipping results in a harsh and typically undesirable audio artifact. In an alternate embodiment, limiting is not applied because the converters effectively limit the audio signal when the low-frequency information is no longer present.

With prior systems, if limiting is relied on too heavily to reduce audio levels, overload and distortion can occur. For example, when the signal processed by the limiter is consistently far above 0 dB, the amount of compression applied by the limiter can cause distortion for similar reasons as explained above with regard to compressors. But, in one aspect, because the analog signal is created at the higher second clock frequency, less low frequencies may be presented and outputted to and from the limiter module 170 than if the signal had been created by playing the audio at the first clock frequency. Providing a signal with less low frequencies, as accomplished in an embodiment herein, can result in less distortion during limiting.

As shown in FIG. 1A, an equalization module 180 may apply equalization to the audio signal. Equalization may alter the frequency response of the audio signal, amplifying some frequencies and/or reducing some frequencies. This can be used, for example, to emphasize different frequencies across the stereo field to make particular sounds, instruments, and/or voices stand out in an audio mix. However, analog equalization hardware, particularly cheap equalization hardware commonly found in home studios, can introduce distortion in the low frequencies if the audio signal is too loud for the equalizer to handle. Therefore, by using an audio signal generated according to a second (i.e., higher) clock frequency), less low-end frequency information is effected by any such distortion.

In the example of FIG. 1A, once the modified analog signal is output from the last effects module (e.g., equalization module 180), the modified analog signal is converted back into a digital audio file through use of an analog-to-digital converter. This conversion occurs without changing the speed of the audio file. In other words, the converted file initially may be set to play at the second clock frequency.

In an alternate embodiment, the analog-to-digital converter may be set to change the playback clock frequency (e.g., sample rate) of the modified audio signal as compared to the original digital audio file without modifying the metadata. In this instance, the playback clock frequency supplied (e.g., using a crystal oscillator) by the analog-to-digital converter may be changed accordingly to cause the modified digital audio file to play at the same speed as the original digital audio file with the second (i.e., higher) playback frequency. In one such embodiment, the external converter may not know the contents of the metadata at any point in the process. In this way, no changes to the sample rate specified in metadata occur in one embodiment.

The resulting manipulated digital audio file is stored on a non-transitory computer-readable storage medium in one embodiment. This non-transitory computer-readable storage medium may be located on computer 115 in one embodiment, such as on a disk drive or some other storage medium. In another embodiment, the non-transitory computer-readable storage medium is located on a separate product or workstation from computer 115.

Once the manipulated digital audio file has been stored, in one aspect, the processor sets the metadata of the manipulated digital audio to indicate the first clock frequency for normal playback speed. This effectively restores the frequency response of the manipulated digital audio file heard when the manipulated digital audio file is played, eliminating any "chipmunk effect" caused by setting the playback frequency to the second (i.e., higher) frequency prior to dynamic enhancement.

The processor that sets the metadata of the manipulated digital audio can be one or more of the processors included in computer 115 in one embodiment. However, because the term "processor" can include a plurality of processors, including processors that are part of different devices and/or workstations, the processor that sets the metadata of the manipulated digital audio to indicate the first clock frequency for normal playback speed may be located somewhere besides computer 115, such as in a different workstation or device in one embodiment.

In an alternate embodiment, one or more of the analog modules 165, 170, and/or 180 are modeled in the digital domain 110. "Modeling" may include a series of algorithms or equations that emulate the effect of hardware used in the analog domain 160 to manipulate the analog signal. For example, each component of a compressor module 165 may be modeled such that a digital effect can be created that functions similarly to the analog counterpart. Rather than applying a particular dynamic enhancement in the analog domain 160, the modeled digital effect is instead applied in the digital domain 110. In this alternate embodiment, digital effects modules may be employed to emulate one or more analog modules 165, 170, 180. For example, the digital audio file 138 may still be played at the second (i.e., higher) frequency, during which time the digital effects are applied to the digital audio signal. Because the digital signal is supplied to the emulated analog circuit at the second (i.e., higher) clock frequency, results similar to those described with respect to the analog domain 160 may be possible.

Figure 1B:
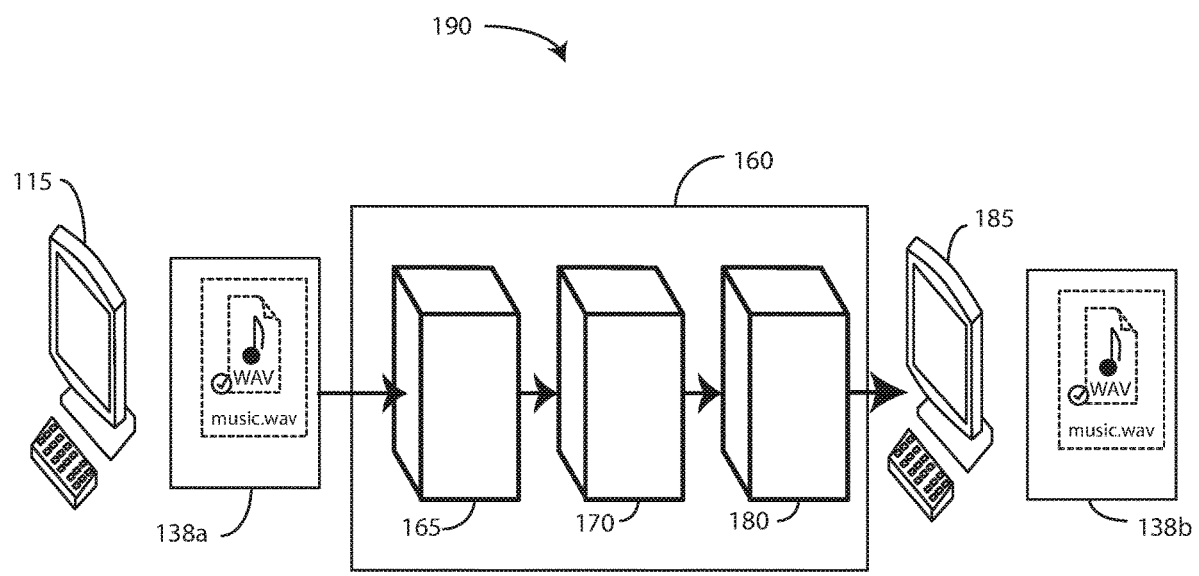
FIG. 1B is an exemplary illustration of an alternate system for processing audio, in accordance with an embodiment.

FIG. 1B is an exemplary illustration of an alternate system 190 for processing audio, in accordance with an embodiment. This alternate embodiment utilizes multiple workstations 115 and 185 to carry out the audio processing. Each workstation 115 and 185 can include its own processor(s). It is understood that reference to a processor herein can include both a first processor of the first workstation 115 and a second processor of the second workstation 185.

In the illustrated system 190, a first workstation 115 may convert the original digital audio file 138a into analog, and send the analog signal to the analog circuit 162 for processing. It is understood that this conversion can utilize an external converter in one embodiment.

Then, the modified (i.e., processed) audio is sent to the second workstation 185. In one embodiment, this includes sending the modified analog signal to the second workstation 185, where it is converted into a modified digital audio file 138b. In this embodiment, the modified digital audio file 138b can be stored on the second workstation 185 or on some other computer-readable medium.

The other aspects the system 190 in FIG. 1B can behave similarly to embodiments described with respect to FIG. 1A.

Figure 2:
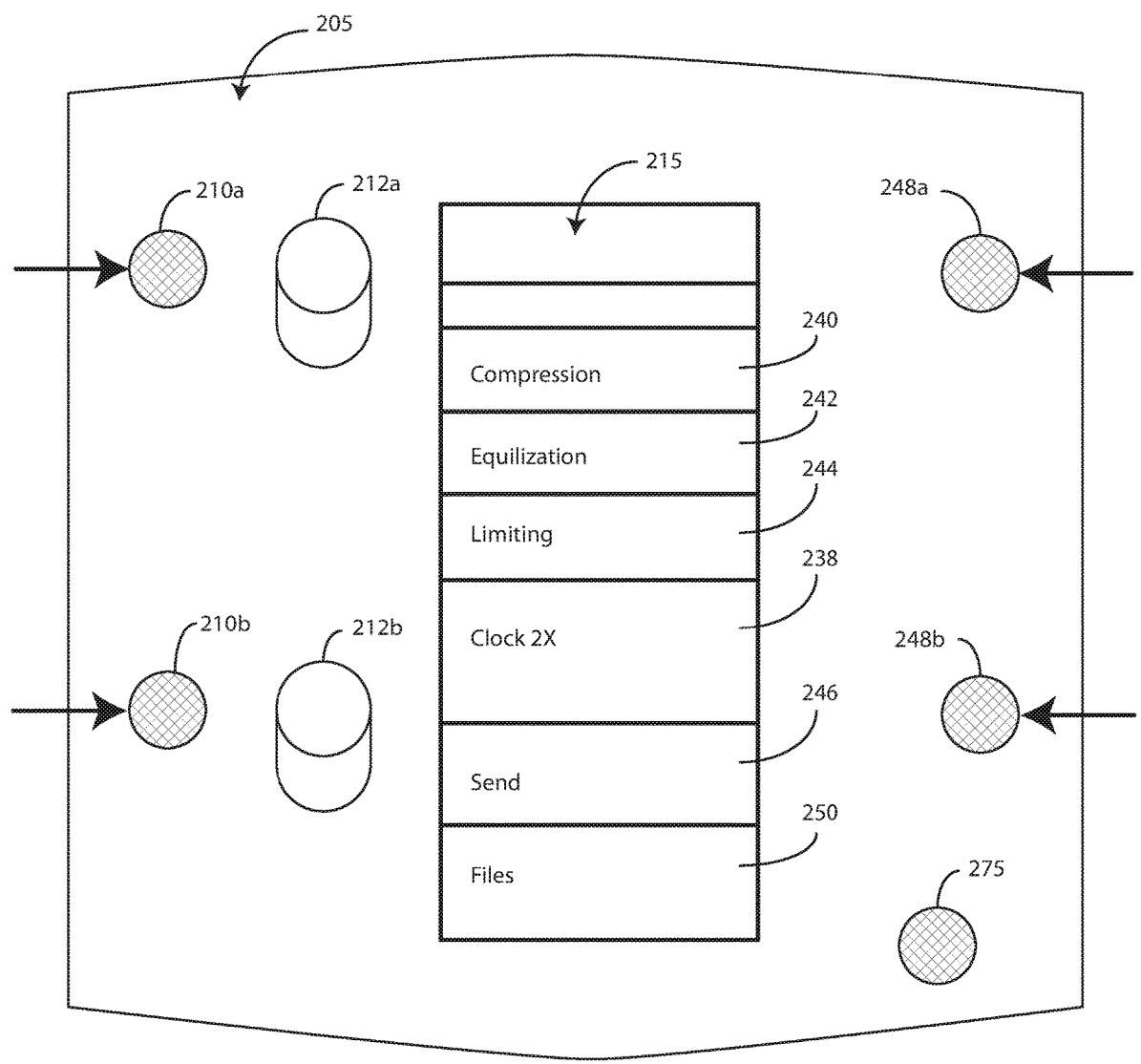
FIG. 2 is an exemplary illustration of an audio processing device, in accordance with an embodiment.

Turning to FIG. 2, an exemplary illustration of an audio processing device 205 is shown in accordance with an embodiment. Audio processing device 205 may be a stand-alone product in one embodiment, that connects to a DAW.

The audio processing device 205 may receive audio information through input 210a in one embodiment. This audio information may be a digital audio file. The digital audio file may be a portion of some larger digital audio file in one embodiment. For example, the audio processing device 205 may interface with an external digital audio workstation (DAW) in one embodiment, and receive a portion of a digital audio file from the DAW. In one embodiment, the DAW may be executing audio sequencing and/or editing software that allows a user to select a portion of a digital audio file for manipulation. Software executed on the DAW, such as a plugin, may facilitate communications between the DAW and the audio processing device 205 such that the workstation may export at least a portion of a digital audio file to the audio processing device 205. These communications may be received by the audio processing device 205 through digital input 210a. The protocol for communications can vary between embodiments. The DAW is able to automate the audio processing from within the DAW software environment in one embodiment, sending one or more commands to the audio processing device 205 to control various aspects of the mastering process.

In one embodiment, the audio processing device 205 also contains an output 210b for sending the manipulated digital audio file to a receiver device. The receiver device can be the DAW, or it can be some other device that includes a non-transient computer-readable storage medium. In one embodiment, the DAW causes the audio processing device 205 to export a manipulated digital audio file back to the DAW. Once the DAW receives the manipulated digital audio file, the DAW may automatically integrate the manipulated digital audio file into the DAW environment. For example, if the DAW is used in a movie production environment, an audio portion of a video file may be sent to the audio processing device 205, and the DAW may automatically replace the audio portion with the manipulated digital audio file received from the audio processing device.

In another embodiment, the manipulated digital audio file is stored on a computer-readable storage medium contained in the audio processing device 205, and is manually exported later, such as by connecting the audio processing device 205 to a DAW and browsing memory contents for the manipulated digital audio file. In this embodiment, the contents of the computer-readable storage medium contained in the audio processing device 205 may be browsed. In one embodiment, the contents are browsed from the DAW. In another embodiment, display 215 is capable of displaying files 250 currently stored on the audio processing device 205.

In one embodiment, a single cable connects the audio processing device 205 to the DAW, through a single connection that encompasses both input 210a and output 210b. This connection may be a transceiver. The embodiments discussed herein are not limited to a specific transfer protocol. For example, USB, Firewire, Ethernet, HDMI, SATA, and SAS are just some of the protocols that may be implemented in various embodiments to facilitate communication and file transfers between the audio processing device 205 and a DAW.

In one embodiment, a first level control 212a is provided to control the volume level of the audio. In one embodiment the level control 212a controls the level of the analog audio signal before it is routed through the analog circuit. In another embodiment, the level control 212a controls the level of the received digital audio file. This may allow a user to raise or lower the volume of the analog or digital audio file before it is manipulated by audio processing. Similarly, in another embodiment, an output level control 212b is provided for adjusting the volume of the manipulated analog audio before it is sent to an analog-to-digital converter. In another embodiment, the output level control 212b controls the level of a manipulated digital audio file (i.e., after audio processing), before the manipulated audio file is sent back to the DAW.

In one embodiment, the audio processing device 205 may contain digital-to-analog converters for converting the digital audio file into an analog signal before audio processing. Similarly, the audio processing device 205 may contain analog-to-digital converters for converting the manipulated audio back into a manipulated digital audio file. In addition or alternatively, the audio processing device 205 may control the DAW to cause the digital-to-analog conversion and analog-to-digital conversion to occur using the converters used by the DAW. For example, if the DAW is already equipped with and/or communicatively coupled to high-end converters, it may be advantageous to use those DAW converters instead of converters that may be built into the audio processing device 205. In still another embodiment, the audio processing device 205 is equipped with an interface for connecting to external converter modules. This may allow the audio processing device 205 to utilize stand-alone converters for the conversion process. The interface can use any protocol known in the art for communicating with D/A and A/D converters.

In the example of FIG. 2, the audio processing device 205 contains a display 215 for assisting the user in applying various dynamic adjustments to the audio. The display 215 can be a liquid crystal display in one embodiment. In another embodiment, the display 215 can be a touch screen display. In one embodiment, the display helps the user control the analog circuit for applying compression 240, equalization 242, and/or limiting 244.

Additionally, in one embodiment, the audio processing device 205 also allows the user to specify the second clock frequency that is used for playing the digital audio file at a faster speed during conversion into an analog audio signal. In one embodiment, the second clock frequency may be selected based on a multiple of the original (i.e., normal) playback clock frequency. For example, as shown in FIG. 2, the user may select to double the playback clock frequency, which results in doubling the frequency response characteristics of the digital audio file, and causes playback to occur at two times the normal playback speed. In this embodiment, the audio processing device 205 may automatically detect the first (i.e., normal) clock frequency of the digital audio file. This can be done, for example, by recognizing the file type, determining the clock frequency metadata that corresponds to that file type, and then retrieving the first clock frequency from the metadata. For example, if the first clock frequency is 44.1 kHz, the second clock frequency in the example of FIG. 2 could be 88.2 kHz. In another embodiment, the user may enter a specific clock frequency to use as the second clock frequency.

The audio processing device 205 may automatically store the first (i.e., normal) clock frequency of the digital audio file, so that the manipulated digital audio file can be restored to the first clock frequency after the manipulated digital audio file is created. In this embodiment, once the manipulated digital audio file is created (e.g., after manipulation by the analog circuit and conversion by the analog-to-digital converter), the audio processing device 205 may set the clock frequency value in the metadata of the manipulated digital audio file to indicate the first clock frequency. Thus, when the manipulated digital audio file is played back on the DAW (or, in one embodiment, on the audio processing device), the playback will sound normal and not have the added "chipmunk" effect.

Additionally, in one embodiment, the audio processing device 205 may send 246 the analog audio signal to external analog devices. For example, output 248a may be used to couple the audio processing device 205 with an external analog device. The analog audio signal can then be sent, for example, to a compressor, limiter, and/or equalization module that resides external to the audio processing device 205. A return 248b may be provided for returning the manipulated analog signal back to the audio processing device 205.

In still another embodiment, the audio processing device 205 may contain a monitoring output for listening to the audio during the mastering process. In general, this allows a user to hear the effects of the mastering and make adjustments to the various modules (i.e., components) of the analog circuit. In one embodiment, the user may listen to the sped-up audio during manipulated by the analog circuit.

In another embodiment, a "time warp" monitoring feature is used for monitoring the analog audio at the normal playback frequency. This may allow a user to listen to the audio without the "chipmunk" effect, and hear how the audio will sound once the playback clock frequency is reset to the first frequency. In one embodiment, the audio processing device 205 may utilize a second pair of analog-to-digital converters to create short digital audio files (i.e., monitoring files) that represent segments of the analog audio signal being manipulated. The processor may then set the playback frequency of the short digital audio files to the first clock frequency, effectively slowing the playback speed to normal. The short digital audio files may then be played in succession by converting them back into an analog signal that is sent to monitors (e.g., speakers and/or headphones).

These short audio files may range in length in various embodiments. In one embodiment, the short digital audio files are 5 seconds long. The audio processing device 205 may create these short monitoring files, for example, by converting an even shorter segment of analog audio to a digital audio file, setting the playback frequency to the slower first frequency. Although this technique necessarily will cause monitoring to lag a few seconds behind any dynamics modifications applied by the user, it may still allow the user to listen to segments of audio without the chipmunk effect, so that the user does not need to complete the mastering process before hearing the results of the dynamics modifications at the normal playback frequency.

Additionally, in one embodiment with the "time warp" monitoring feature, the user can select the length of the monitoring segments. While longer lengths may allow a more natural listening experience (i.e., less chopped up audio segments), more time will lapse between when the user makes a dynamic adjustment (i.e., compression, limiting, and/or equalization) and when the user can actually hear the result of the adjustment at the first playback frequency.

The analog audio segments that are converted for monitoring purposes may not be continuous. This is because audio files play slower at the first clock frequency than at the second clock frequency. Therefore, to ensure that the monitoring does not lag too far behind the dynamics adjustments made by the user, the time interval (e.g., 5 second) specified by the user may be used to "catch up" the monitored files, such that at the beginning of each time interval a new monitoring segment begins near real time. With this method, monitoring segments of shorter lengths, such as 1 second, may allow for monitoring near real time, but with choppy playback since each segment begins near real time based on the manipulated audio signal, which is playing at a faster speed based on being created with the second clock frequency.

In one embodiment, the user may manually select whether the monitoring output is real time monitoring of the sped up playback, or time warped monitoring of the manipulated audio signal.

Figure 3A:
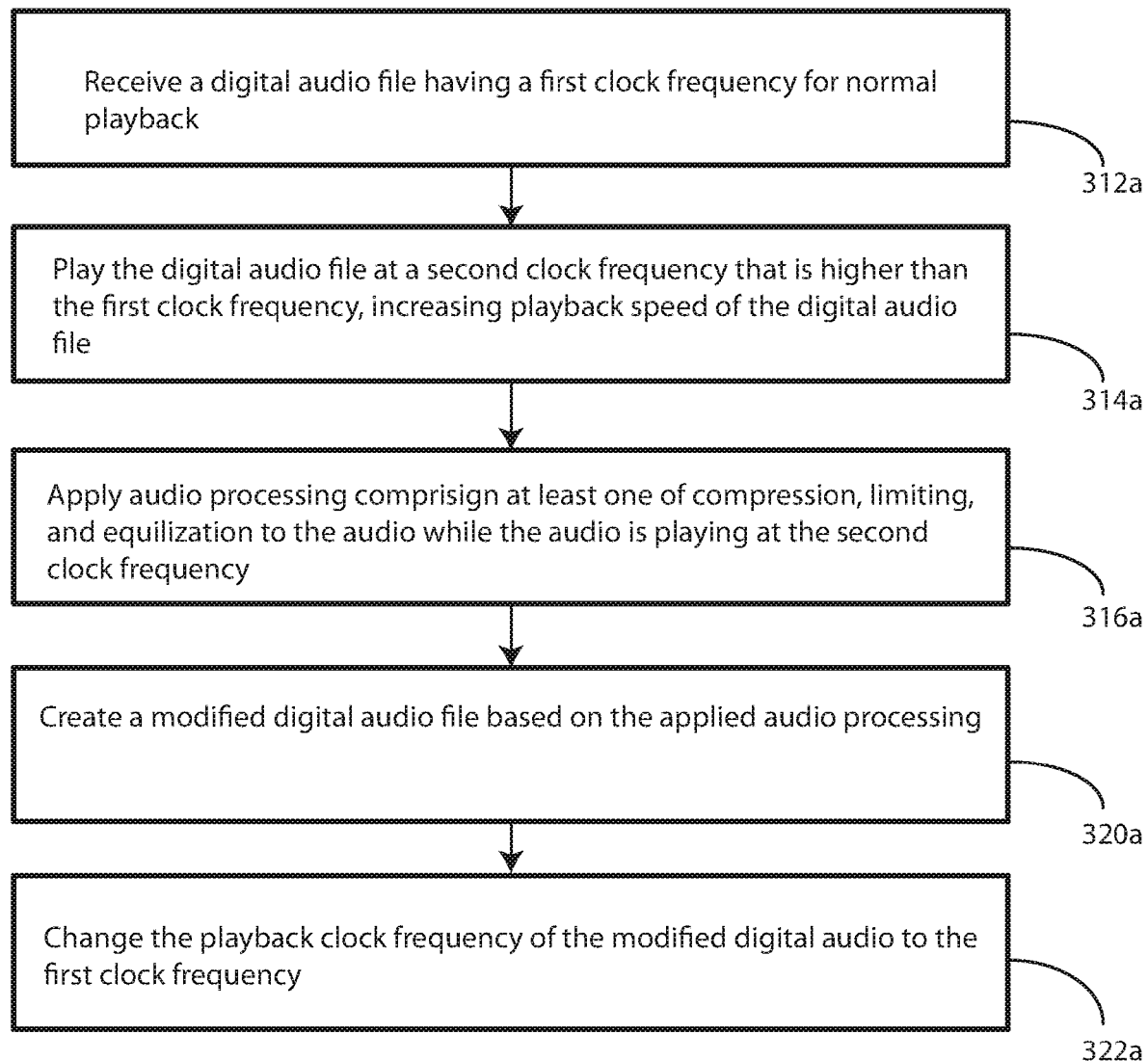
FIGS. 3A-B are exemplary flow charts with non-exhaustive listings of steps that may be performed in an audio processing environment, in accordance with an embodiment.
Figure 3B:
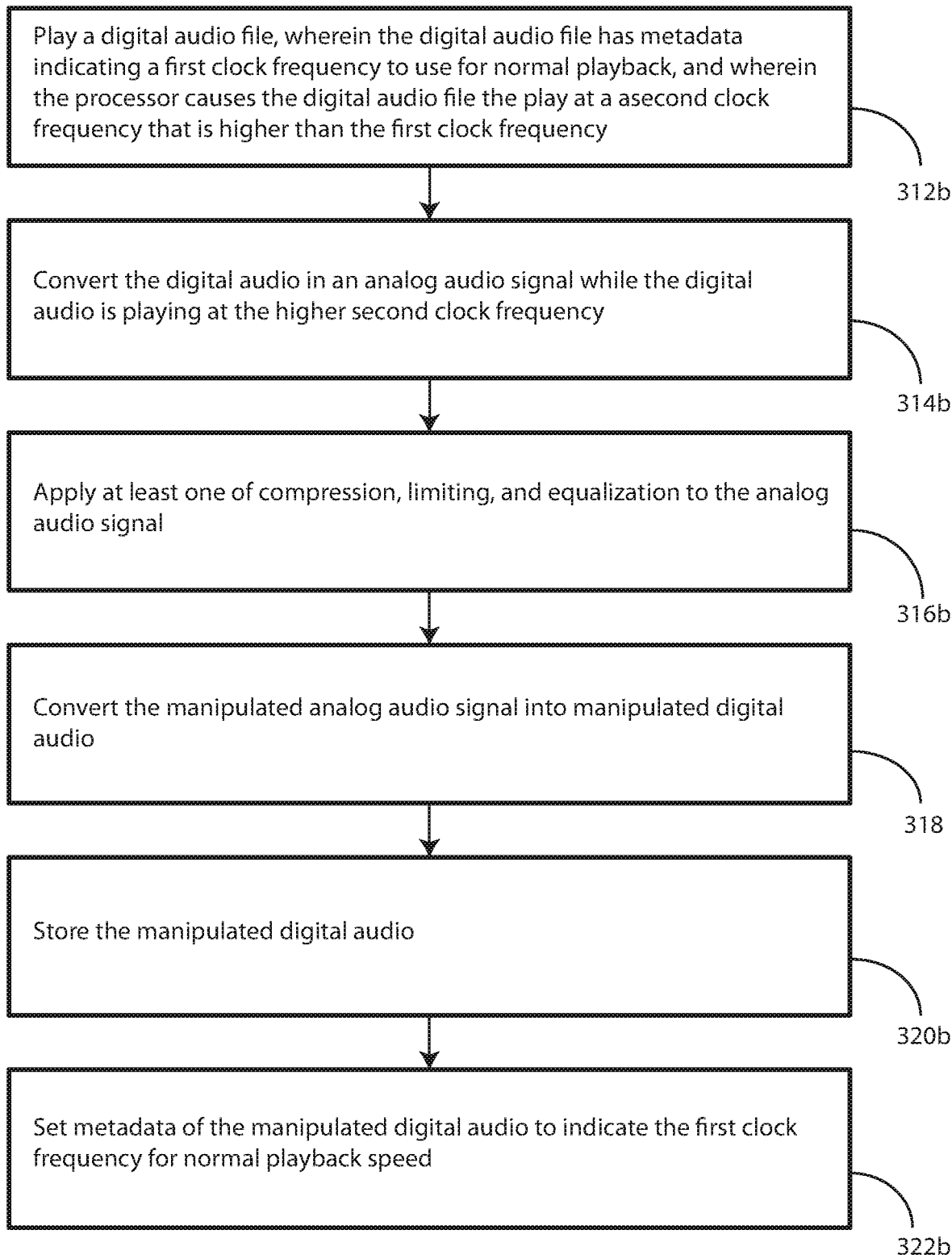

FIGS. 3A-B are exemplary flow charts with non-exhaustive listings of steps that may be performed in accordance with an embodiment. At step 812a of FIG. 3A, a DAW (e.g., computer, audio processing device, etc.) receives a digital audio file having a first clock frequency for normal playback. The digital audio file may be received by importing the file in one embodiment. The digital audio file may also be received by recording audio onto a computer-readable medium.

As step 812a of FIG. 3A indicates, the digital audio file has a first clock frequency associated with it for normal playback. Similarly, in step 812b of FIG. 3B, a processor plays a digital audio file, wherein the digital audio file has metadata indicating a first clock frequency to use for normal playback. Because digital audio files can be created using various different sample rates, the first frequency for normal playback may correlate to the sample and bit rate of the particular digital audio file. Normal playback includes playing the audio file back without changing the pitch or the speed of the digital audio file.

At step 812b, the processor causes the digital audio file to play at a second clock frequency that is higher than the first clock frequency. Similarly, at step 814a, the digital audio file is played at a second clock frequency that is higher than the first clock frequency, increasing playback speed of the digital audio file.

In one embodiment, the steps of FIG. 3A are performed purely in the digital domain. For example, although step 814a may include converting the digital audio file into an analog signal, in one embodiment the digital audio file is played purely in the digital domain. In step 814a, playback does not necessarily require the digital audio to be audible to a listener. In a purely digital context, the digital audio file may be played by processing it as if it were being converted into analog but without using a physical digital-to-analog converter. Instead, the processor may route the audio information to a plugin, which utilizes the second clock frequency. A processor may read the digital audio file at the second playback frequency, and apply formulas (representing analog models) to the resulting time-based array of bits to apply compression, limiting, and/or equalization. Because accurate digital models of the analog components may behave similarly to the corresponding analog components, processing the digital audio file at the second clock frequency as described herein may provide similar benefits to those already outlined with regard to processing the analog signal with the analog circuit.

The other steps of FIG. 3A may also be carried out in the digital domain in one embodiment. As discussed above, at step 316, the processor may apply audio processing (e.g., via plugin) comprising at least one of compression, limiting, and equalization to the audio while utilizing (e.g., internally playing the audio file at) the second clock frequency.

Then, at step 320a, the processor may create a modified digital audio file based on the applied audio processing. This may include saving the manipulated digital audio file, which has modified contents, over the source (i.e., original) digital audio file. In another embodiment, the manipulated digital audio file is saved separately from the original digital audio file.

Finally, at step 322a, the processor may change the playback clock frequency of the modified digital audio to the first clock frequency, ensuring proper playback of the manipulated digital audio file.

Unlike FIG. 3A, the steps of FIG. 3B necessarily require converting the digital audio file for processing within the analog domain. In particular, step 814b includes converting the digital audio into an analog audio signal while the digital audio is playing at the higher second clock frequency.

Then, step 316b includes applying at least one of compression, limiting, and equalization to the analog audio signal. This can include, for example, passing the analog audio signal through a circuit containing analog hardware that modifies characteristics of the audio signal.

At step 318, the an analog-to-digital converter may convert the manipulated analog audio signal into manipulated digital audio. Then, at step 320b, the processor stores the manipulated digital audio on a computer-readable storage medium. This computer readable storage medium may be located on a separate workstation than the workstation that played the digital audio file in one embodiment.

Finally, at step 322b, the processor may set metadata of the manipulated digital audio to indicate the first clock frequency for normal playback speed.

Figure 4:
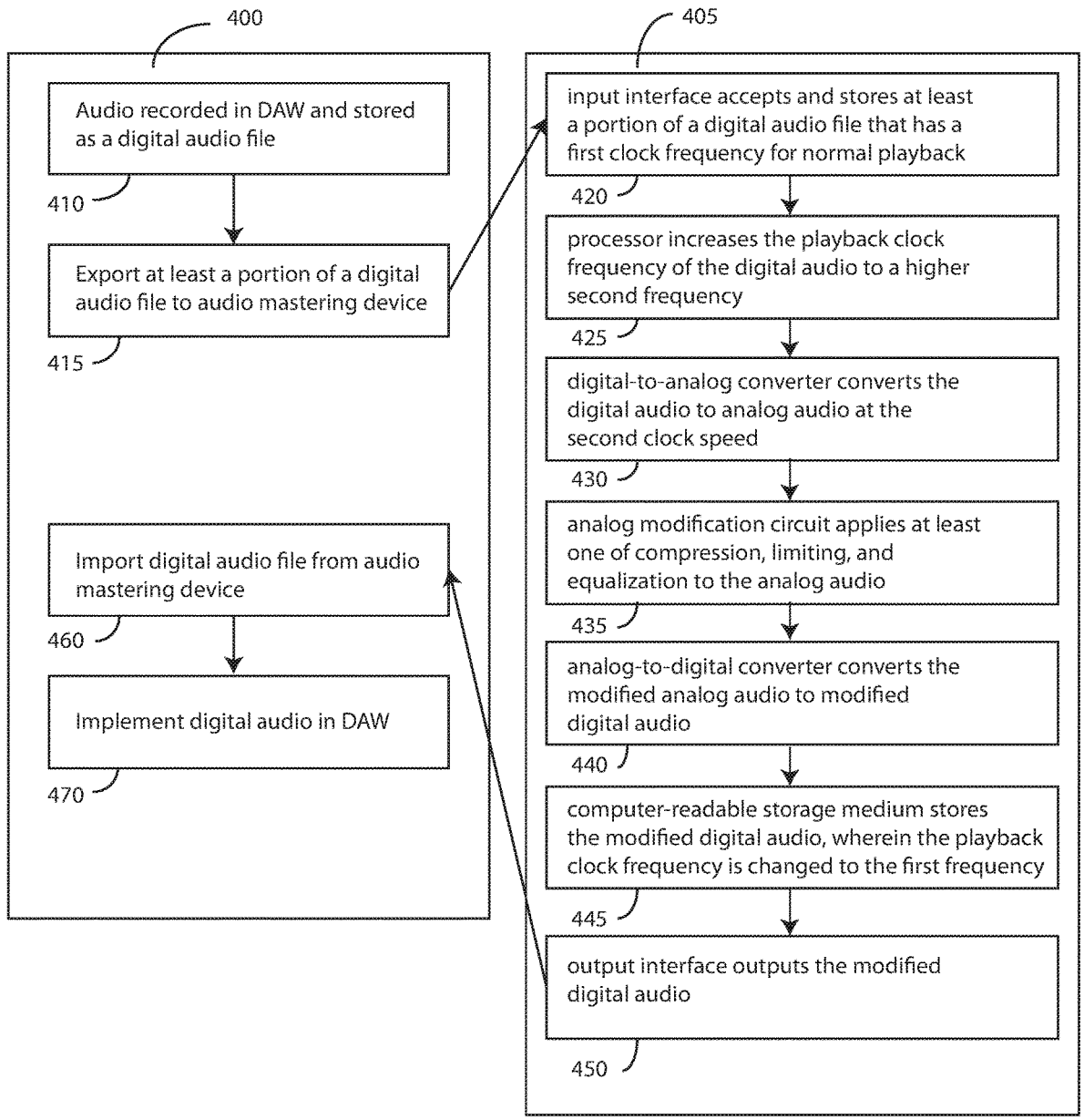
FIG. 4 is an exemplary flow chart with a non-exhaustive listing of steps that may be performed by a digital audio workstation and an audio processing device that interface with one another, in accordance with an embodiment.

FIG. 4 is an exemplary flow chart with a non-exhaustive listing of steps that may be performed by a digital audio workstation (DAW) and an audio processing device 205 while they interface with one another, in accordance with an embodiment.

In this example, box 400 contains a non-exhaustive listing of steps performed by the DAW. Box 405 contains a non-exhaustive listing of steps performed by the audio processing device.

At step 410, audio may be recorded in the DAW and stored as a digital audio file.

In one embodiment, the DAW receives input from the user to perform step 415, which includes exporting at least a portion of the digital audio file to the audio processing device. For example, the user may select a single track within the sequencing environment to export. Alternatively, the user may select just a portion of a single track to export. Still further, the user may select a mixdown of an entire mix to export.

In the example of FIG. 4, the digital audio file is exported prior to increasing the playback clock frequency of the digital audio file. However, in an alternate embodiment, the frequency is increased prior to exporting the digital audio file. In that alternate embodiment, the DAW may output a representation of the audio at the second clock frequency for modification, wherein the modification includes at least one of compression, equalization, and limiting. This representation can be analog in one embodiment, or digital in another embodiment.

At step 420, an input interface of the audio processing device 205 accepts and stores the digital audio file. The input interface can include an input port, receiver circuitry, and the processor, which may receive data according to a protocol recognized by the DAW.

At step 425, the processor increases the playback clock frequency of the digital audio to a higher second frequency. In this way, the audio processing device 205 may modify a digital audio file that normally has a first clock frequency for playback to instead have a second clock frequency that is higher than the first clock frequency. As mentioned above, this step may instead occur on the DAW in one embodiment.

At step 430, a digital-to-analog converter converts the digital audio file into analog audio while the digital audio file plays at the second clock speed.

At step 435, the analog signal is passed through the analog modification circuit, which applies at least one of compression, limiting, and equalization to the analog audio signal.

Then, at step 440, the analog-to-digital converter converts the modified analog audio into modified digital audio.

At step 445, that modified digital audio may be stored on a computer-readable storage medium, after which the playback clock frequency is changed to the first frequency. This storage medium may be located on the audio processing device 205 in one embodiment. In another embodiment, the computer-readable medium is located externally to the audio processing device.

At step 450, an output interface outputs the modified digital audio. In one embodiment, step 450 is performed in unison with step 445.

At step 460, the DAW imports the digital audio file form the audio processing device.

At step 470, the DAW implements the modified (i.e., manipulated) digital audio, which can include adding the modified digital audio file to a sequencer environment to replace or provide an alternative to the portion of the digital audio file initially exported to the audio processing device.

Figure 5:
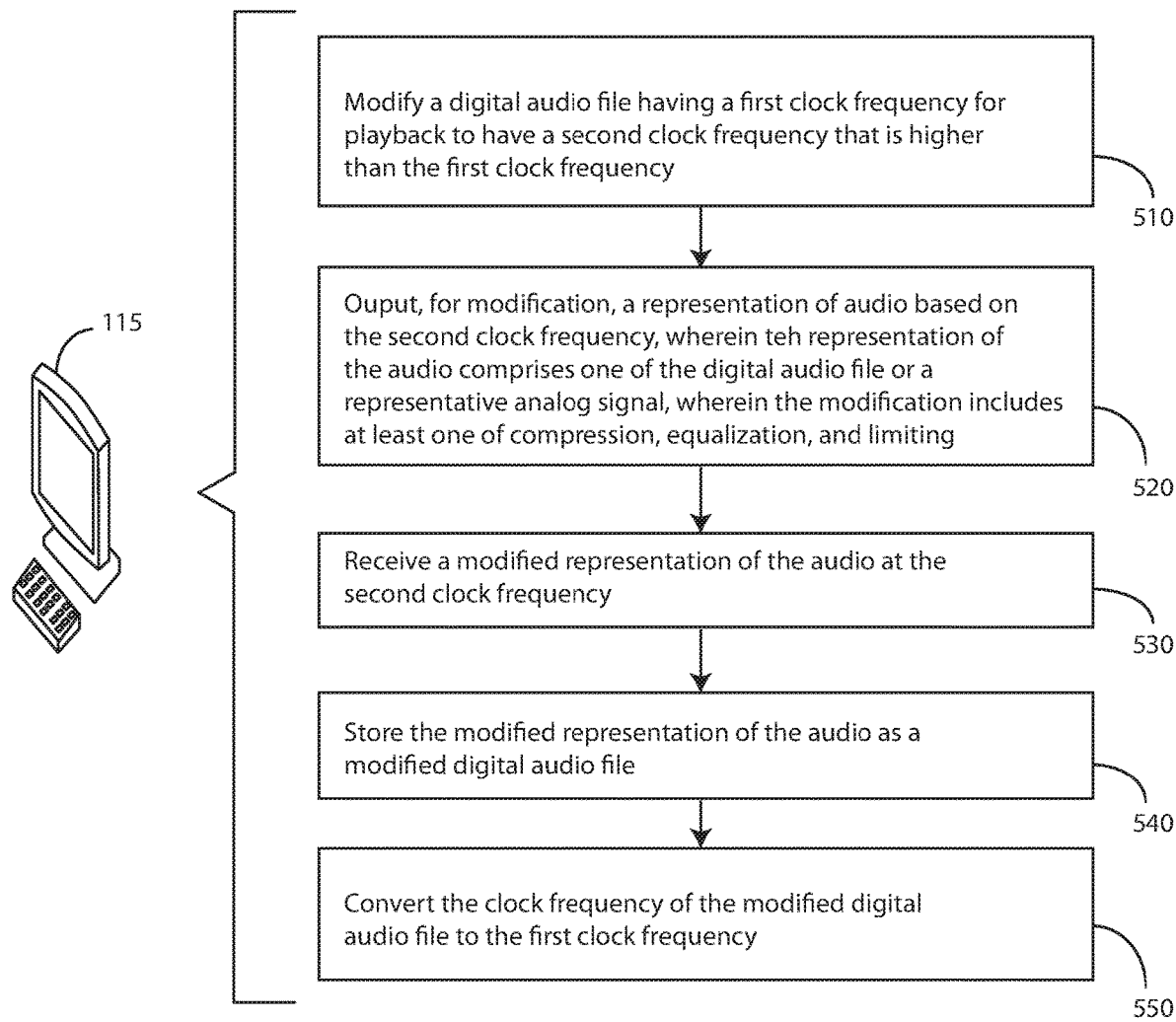
FIG. 5 is an exemplary flow chart with a non-exhaustive listing of steps that may be performed by a digital audio workstation (DAW).

Turning to FIG. 5, an exemplary flow chart is presented with a non-exhaustive listing of steps that may be performed by a digital audio workstation (DAW) 115.

At step 510, the DAW may modify a digital audio file having a first clock frequency for playback to have a second clock frequency that is higher than the first clock frequency.

At step 520, the DAW may output a representation of audio based on the second clock frequency for modification. For example, the representation may be digital in one embodiment, including reading the digital audio file at the second clock frequency. In another embodiment, the representation may be a representative audio signal, such as the audio signal resulting from performing a digital-to-analog conversion of the digital audio file by the DAW or an external converter in communication with the DAW.

The outputted representation may then be modified externally from the DAW. This modification may include at least one of compression, equalization, and limiting, as previously discussed herein.

At step 530, after the representation of the audio is externally manipulated, the DAW may receive a modified representation of the audio at the second clock frequency. In one embodiment, the modified representation is a digital audio file. In another embodiment, the modified representation is an audio signal (e.g., the conversion may occur on the DAW).

At step 540, the DAW may store the modified representation of the audio as a modified digital audio file. If the modified representation is an analog signal, this step includes converting the analog signal into the modified digital audio file.

At step 550, the DAW may convert the clock frequency of the modified digital audio file to the first clock frequency for proper playback.

Figure 6:
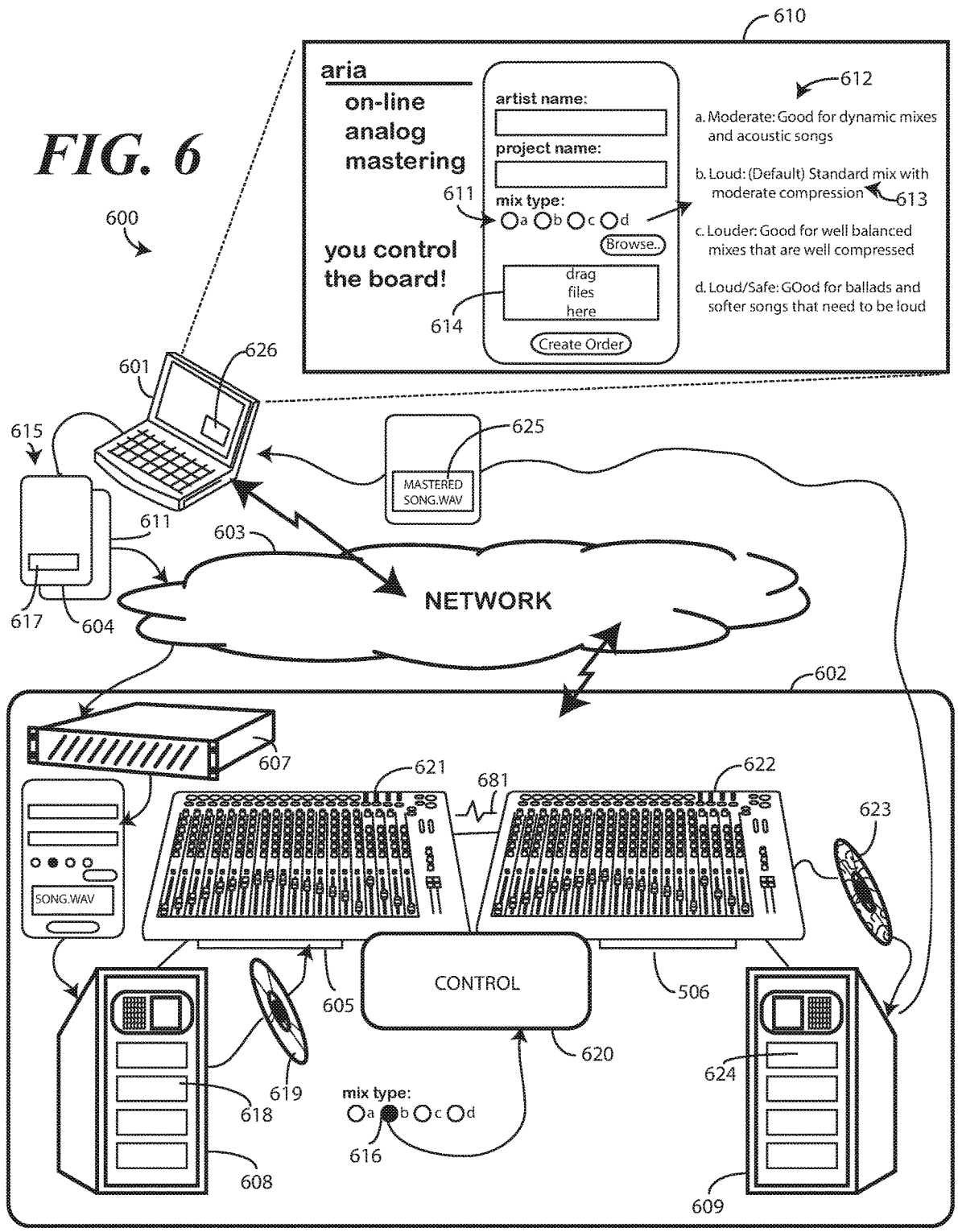
FIG. 6 illustrated one explanatory system in accordance with one or more embodiments of the disclosure.

Turning now to FIG. 6, illustrated therein is another audio processing system 600 configured in accordance with one or more embodiments of the disclosure. The audio processing system comprises a remote device, i.e., a client device 601, which is in communication with a server complex 602 across a network 603. In one embodiment, the network 603 is the Internet. The client device 601 can take any of a variety of forms, including computers, tablet computers, smartphones, and other devices. Illustrating by example, in one embodiment the client device 601 comprises a tablet computer running a web browser to access a user interface 610. Advantageously, in one or more embodiments the user interface 610 of the audio processing system 600 allows a user to control one or more analog signal processors 605,606 remotely, across the network 603, to master a digital audio file 604 in the analog domain.

The server complex 602 can include one or more of computers, workstations, servers, and/or other devices. In FIG. 6, the server complex 602 is shown has having only a single server 607 for brevity. However, one or more intermediate servers can be disposed between the single server 607 and the client device 601. Additionally, as will be described in more detail with reference to FIG. 11 below, in other embodiments one or more cloud-based devices can be disposed between the server complex 602 and the client device 601. The single server 607 of the server complex 602 can even be a cloud-based device. Other configurations of the server complex 602 will be obvious to those of ordinary skill in the art having the benefit of this disclosure.

In one or more embodiments, the server complex includes a first digital audio workstation 608 and a second digital audio workstation 609. The first digital audio workstation 608 and the second digital audio workstation 609 of this embodiment are disposed to either side of one or more analog signal processors 605,606. The first digital audio workstation 608, the one or more analog signal processors 605,606, and the second digital audio workstation 609 work in tandem to carry out audio processing. In this example, the components of the server complex 602 are split into a digital domain, e.g., signals processed by either the first digital audio workstation 608 and a second digital audio workstation 609, and analog domain, e.g., signals processed by the one or more analog signal processors 605,606.

The server complex 602 provides users with access to the mastering components, e.g., the first digital audio workstation 608, the one or more analog signal processors 605,606, and the second digital audio workstation 609 across the network 603. In one embodiment, the server complex 602 delivers a user interface 610 for presentation on the client device 601.

In one or more embodiments, the user interface 610 is operable to receive one or more analog domain control settings 611 that are used to control the one or more analog signal processors 605,606 and/or the first digital audio workstation 608 and the second digital audio workstation 609. For instance, in this illustrative example the user interface 610 comprises a loudness level selection 612 defining a loudness level 613 associated with a digital audio file 604.

In one or more embodiments, the user interface 610 is also operable to receive the digital audio file 604. In this illustrative embodiment, the user interface 610 also comprises a network upload portal 614 through which the server complex 602 can receive an upload 615 of the digital audio file 604 through the network upload portal 614.

When a user wishes to master a digital audio file 604 in the analog domain, they simply navigate to the user interface 610. For example, in one embodiment the user launches a web browser on the client device 601 to navigate to the user interface 610. Once at the user interface 610, the user may enter identifying information, such as their name and digital audio file title. The user can also upload 615 the digital audio file 604 to the server complex 602 using the network upload portal 614.

In one or more embodiments, the user also establishes one or more analog domain control settings 611 that will be used in the analog domain during the mastering. In this simple example, the user selects a loudness level 613 associated with a digital audio file 604 using the loudness level selection 612. The options presented in this example are (1) Moderate loudness level, which is good for dynamic mixes and acoustic songs, (2) Loud loudness level, which is suitable for standard mixes with moderate compression, (3) Louder loudness level, which is suitable for well balanced mixes that are well compressed, and (4) a Loud/Safe loudness level, which is suitable for ballads and softer songs that need to be louder. In this illustrative embodiment, the loud loudness level is the default value, and also happens to be the selected loudness level 616 of the user. When the digital audio file 604 is uploaded, so too are the one or more analog domain control settings 611.

The server complex 602 then receives the digital audio file 604 and the one or more analog domain control settings 611 from the client device 601 across the network 603. In this illustrative example, the server complex 602 includes a first digital audio workstation 608 that stores the received digital audio file 604, and optionally the one or more analog domain control settings 611. Alternatively, the server 607 stores the one or more analog domain control settings. The digital audio workstation 608 can comprise at least one processor and a memory or other computer readable storage medium. In one embodiment, the digital audio workstation 608 is a stand-alone device built specifically for handling audio production, mixing, and/or processing. For example, the digital audio workstation 608 may have an integrated mixer, audio sequencer, and/or effects capabilities. In another embodiment, the digital audio workstation 608 can comprise a personal computer with software being executed by a processor for the purpose of audio production, recording, mixing, and/or mastering.

The digital audio file 604 can be received by the server complex 602 in any of a variety of formats, including .WAV, .AIFF, SDII, AC3, DSD, or other audio file formats. For example, the digital audio file 604 shown in FIG. 1 is a .WAV file, which is compatible with the Windows™ operating system and typically contains non-compressed audio information. This means that the digital audio file 604 can be a relatively large file that contains all recorded audio information. However, other file types are possible. For example, the digital audio file 604 can even include a video file type, such as .AVI, to the extent that the video file type includes an audio track or portion.

The digital audio file 604 may also contain metadata 617 that specifies characteristics of the digital audio file 604, such as the bit rate and the sample rate. Other characteristics can also be identified in the metadata 617 as well. For example, .WAV files contain a header that can indicate surround sound and speaker positions, provide information regarding sample types, and supports defining custom extensions to the format chunk. The sample rate may indicate the number of samples per second used in a digital representation of an analog signal. The bit rate may indicate the number of bits used to represent the level of the sample. In theory, the higher the sample rate and bit rate, the closer a discrete digital audio file represents the continuous analog audio signal that it emulates.

In one or more embodiments, the first digital audio workstation 608 comprises a digital-to-analog converter 618. The digital-to-analog converter 618 can be configured as a sound card of the first digital audio workstation 608 in one embodiment. In another embodiment, the digital-to-analog converter 618 can be configured as a standalone component located externally to, but operable with, the first digital audio workstation 608.

The digital-to-analog converter 618 can receive the digital audio file 604 from the server 607 of the server complex 602 and can convert the digital audio file 604 to an analog signal 619. In this example, the first digital audio workstation 608 may convert the digital audio file 604 into an analog signal 619 and send the analog signal 619 to the one or more analog signal processors 605,606 for processing. It is understood that this conversion can utilize an external converter in one embodiment.

In one or more embodiments, a control device 620 is operable to control the one or more analog signal processors 605,606. As will be described in subsequent figures below, the control device 620 can take a variety of forms, including one or more of a robotic arm, digitally controlled relays, voltage controlled filters, digitally controlled servo-driven potentiometers, digitally controlled servo-driven attenuators, digitally controlled voltage controlled amplifiers, digitally controlled variable gain amplifiers, or combinations thereof. Other control devices suitable for controlling the one or more analog signal processors 605,606 will be obvious to those of ordinary skill in the art having the benefit of this disclosure.

The control device 620 receives the one or more analog domain control settings 611 from the server 607 of the server complex 602 or the first digital audio workstation 608, and applies them to the one or more analog signal processors 605,606. Illustrating by example, if the one or more analog signal processors 605,606 comprise resistors, capacitors, inductors, operational amplifier, vacuum tubes, transistors, or other analog components, as controlled by one or more mixing consoles 621,622, and the control device 620 is a robotic arm, the robotic arm can adjust the knobs, sliders, and other controls of the mixing consoles 621,622 to apply setting adjustments to adjust the same to configure the one or more analog signal processors 605,606 in accordance with the one or more analog domain control settings 611 received from the client device 601.

In one or more embodiments, once the digital audio file 604 is converted to the analog signal 619, it is delivered from the first digital audio workstation 608 to the one or more analog signal processors 605,606. The one or more analog signal processors 605,606 receive the analog signal 619 from the digital-to-analog converter 618 and apply at least one dynamic analog modification 681 to the analog signal 619 in accordance with the one or more analog domain control settings 611 received from the client device 601 (since the control device 620 has set the mixing consoles 621,622 in accordance with the one or more analog domain control settings 611 to the analog signal 619 to obtain modified analog signal 623.

Figure 7:
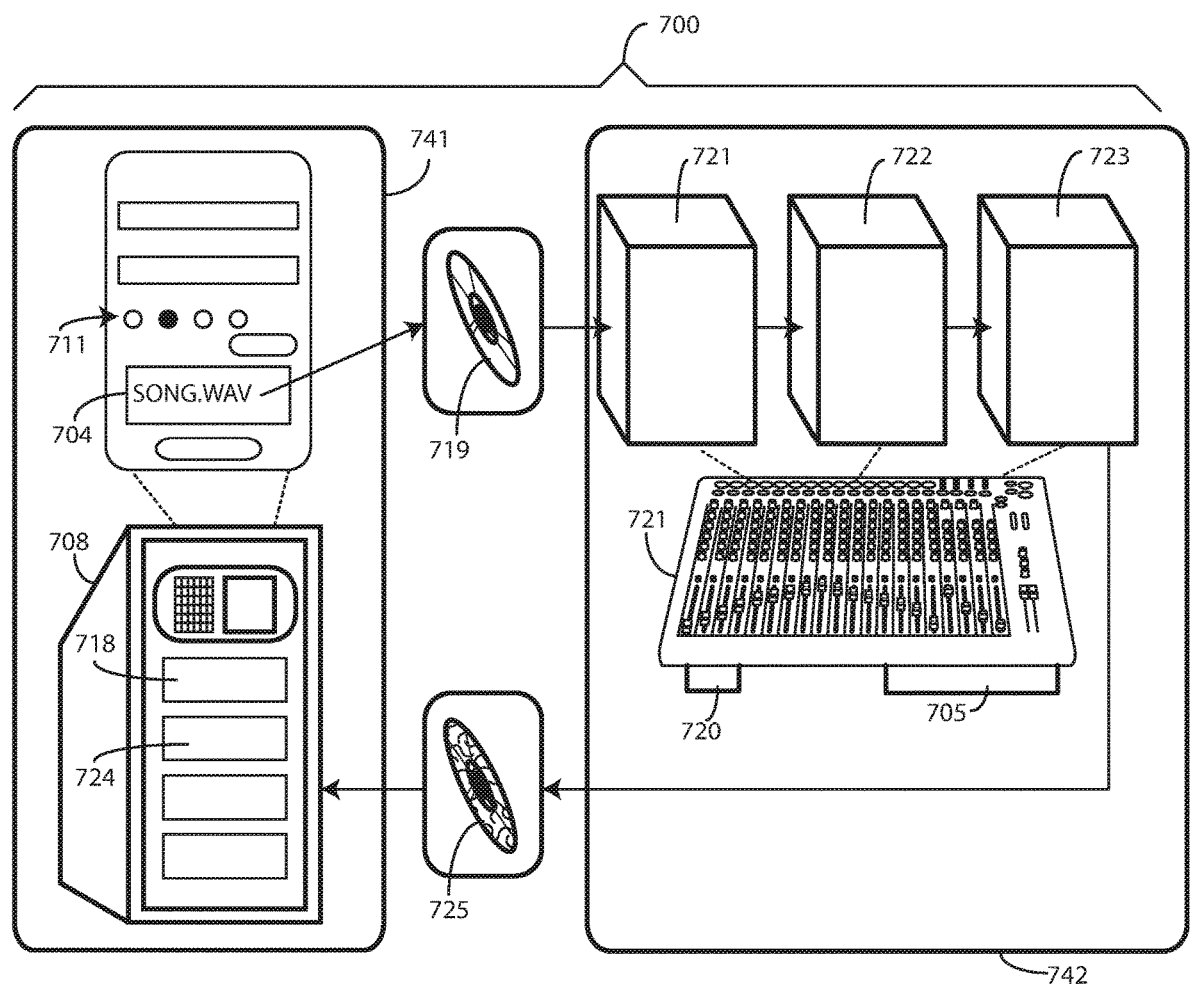
FIG. 7 illustrates one alternate server complex in accordance with one or more embodiments of the disclosure.

The dynamic modifications or effects applied by the one or more analog signal processors 605,606 may include at least one of compression, limiting, and equalization. In some embodiments, additional effects are possible, such as stereo field effects, exciter effects, tape emulation effects, etc. In order to apply these effects, one or more analog signal processors 605,606 one or more hardware modules. (Examples of such hardware modules, integrated into the analog signal processors 605,606 of FIG. 6, are shown in FIG. 7 as modules 721,722,723.) The modules may comprise any known combination of circuitry and analog components for applying compression, limiting, and/or equalization, depending on the dynamic effect applied by the particular module.

Additionally, each of the modules may be connected to one another in an effects chain in one embodiment. In an effects chain, the output from one module can serve as an input for another module. For example, a compressor module (721) may output a modified analog signal that is received as an input at a limiter module (722). The output of limiter module (722) may then be received as an input of equalization module (723).

The compressor module (721) is used to compress the dynamic range of the analog signal 619. This type of compression is distinct from data compression, in which the information is optimized for a smaller file size. In dynamic range compression, quiet sounds can be made louder by reducing the dynamic range of loudness and amplifying the quiet sounds.

The type of compression applied may vary between embodiments. For example, a peak sensing compressor may respond to an instantaneous level of the input signal. This type of compression may provide tighter peak control, but can yield very quick changes in gain reduction, which under traditional audio processing methods can lead to audible distortion. Alternatively, an averaging compressor may be used to apply an averaging function (such as root mean squared ("RMS")) on the input signal before its level is compared to the threshold. Some compressors may include controls or inputs to set a compression ratio, which typically determines the reduction of signal loudness, and a gain level to increase the loudness of the audio signal. Other controls, such as attack, release, and knee control may be provided to help shape the compression. The attack may determine the period when the compressor decreases gain to reach the level governed by the ratio. The release may determine the period when the compressor is increasing gain to the level governed by the ratio, or, to zero dB, once the level has fallen below the threshold. The length of each period may be determined by the rate of change and the required change in gain. In one embodiment, the attack and release times are adjustable by the user. In another embodiment, the attack and release times determined by the circuit design and cannot be adjusted by the user.

A limiter module (722) may receive a modified analog signal from compressor module (721). Limiting, as provided by the limiter module (722), is technically another form of compression that includes a very high compression ratio. For example, a compression ratio between 60:1 and .infin.:1 may be used in limiting. The purpose of limiting is generally to keep the analog signal 619 level below 0 dB, to avoid "clipping." Audio engineers and producers typically try to avoid clipping because clipping results in a harsh and typically undesirable audio artifact. In an alternate embodiment, limiting is not applied because the converters effectively limit the audio signal when the low-frequency information is no longer present.

With prior systems, if limiting is relied on too heavily to reduce audio levels, overload and distortion can occur. For example, when the signal processed by the limiter is consistently far above 0 dB, the amount of compression applied by the limiter can cause distortion for similar reasons as explained above with regard to compressors. Advantageously, by being able to remotely control the one or more analog signal processors 605,606 remotely with the one or more analog domain control settings 611, this overload and distortion can be avoided without the need of traveling to the studio.

An equalization module (723) may apply equalization to the analog signal 619. Equalization may alter the frequency response of the audio signal, amplifying some frequencies and/or reducing some frequencies. This can be used, for example, to emphasize different frequencies across the stereo field to make particular sounds, instruments, and/or voices stand out in an audio mix. However, analog equalization hardware, particularly cheap equalization hardware commonly found in home studios, can introduce distortion in the low frequencies if the audio signal is too loud for the equalizer to handle. Advantageously, by being able to remotely control the one or more analog signal processors 605,606 remotely with the one or more analog domain control settings 611, this overload and distortion can be avoided without the need of traveling to the studio. Note that while in this example compression is provided first, then limiting, and then equalization, effects may also be provided in other orders. For example, equalization may be applied before any compression in another embodiment.

In this illustrative embodiment, the server complex 602 also includes a second digital audio workstation 609. In one embodiment, the second digital audio workstation 609 comprises an analog-to-digital converter 624. After the one or more analog signal processors 605,606 apply the dynamic analog modification(s) to the analog signal 619 in accordance with the one or more analog domain control settings 611 received from the client device 601 across the network 603 to create the modified analog signal 623, the analog-to-digital converter 624 converts the modified analog signal 623 into a modified digital audio file 625.

In one or more embodiments, the modified digital audio file 625 is then stored in a memory device or other non-transitory computer-readable storage medium at the second digital audio workstation 609. Examples of such a memory or non-transitory computer-readable storage medium include a disk drive or some other storage medium. However, in another embodiment, the memory or other non-transitory computer-readable storage medium is located on a separate product or workstation from the second digital audio workstation 609, either in the cloud or within the server complex 602. One example of such a separate device would be server 607.

In one or more embodiments, the server complex 602 presents a network download portal 626 facilitating download of the modified digital audio file 625 across the network 603. Using the network download portal 626, the user can download the modified digital audio file 625 to the client device 601 or another storage medium. Accordingly without ever visiting the server complex 602 or its associated studio, the user is able to master the digital audio file 604, using their own prescribed settings for the one or more analog signal processors 605,606. Prior art systems are simply unable to allow such remote control of analog components.

In one or more embodiments, the server complex 602 includes components that synchronize delivery of the analog signal 619 to the one or more analog signal processors 605,606 and receipt of the modified analog signal 623 from the one or more analog signal processors 605,606. One reason such synchronization may be required is due to the fact that digital files are non-transitory, while audio signals are transitory. Accordingly, when an audio signal is delivered to the one or more analog signal processors 605,606, it passes therethrough without storage. Where a first digital audio workstation 608 and a second digital audio workstation 609 are included, synchronization may be required to alert, for example, the second digital audio workstation 609 that the first digital audio workstation 608 is delivering the analog signal 619 to the one or more analog signal processors 605,606 so that the second digital audio workstation 609 can listen to receive the modified analog signal 623.

In this illustrative embodiment, the server 607 of the server complex 602 is operable to synchronize delivery of the analog signal 619 to the one or more analog signal processors 605,606 and the conversion of the analog signal 619 to the modified digital audio file 625. First digital audio workstation 608 is referred to as the "pitch" workstation, while the second digital audio workstation 609 is referred to as the "catch" workstation. This is the convention because "pitch" pitches the analog signal 619 to the one or more analog signal processors 605,606, while "catch" catches the modified analog signal 623 from the one or more analog signal processors 605,606.

In one or more embodiments, server 607 synchronizes pitch and catch by actuating the analog-to-digital converter 624 of catch when the digital-to-analog converter 618 of pitch delivers the analog signal 619 to the one or more analog signal processors 605,606. This allows catch to receive the modified analog signal 623 as it is output from the one or more analog signal processors 605,606. Thus, in one or more embodiments the server complex 602 causes a concurrent initiation of a conversion of the digital audio file 604 to the analog signal 619 at the first digital audio workstation 608 to deliver the analog signal 619 to the one or more analog signal processors 605,606 and conversion of the modified analog signal 623 at the second digital audio workstation 609 to a modified digital audio file 625 after the application of the at least one dynamic analog modification 681.

In one or more embodiments, prior to applying the dynamic analog modification 681 to the analog signal 619, the sample rate of the digital audio file 604 can be converted to a predefined or standard sample rate. The sample rate may indicate the number of samples per second used in a digital representation of an analog signal. The bit rate may indicate the number of bits used to represent the level of the sample. In theory, the higher the sample rate and bit rate, the closer a discrete digital audio file represents the continuous analog audio signal that it emulates.

It is known that the normal playback or recording frequency, referred to as a "sample rate" in the digital domain, can vary between different digital audio files. The playback frequency can be identified in the metadata 617 as the sample rate associated with the digital audio file 604. For example, the standard sample rate, i.e., normal playback frequency, used for digital audio files on audio compact discs is 44,100 samples per second (44.1 kHz), with 16 bits of information per sample. Digital Video Discs on the other hand, contain digital audio files with a sample rate of 48 kHz and 24 bits of information per sample.

Audio and music files can be recorded at a variety of different sample rates. Each different sample rate results in a different normal playback frequency. For example, some professional audio hardware provides the option for sample rates of 88.2 kHz, 96 kHz, and/or 192 kHz. Even though standard audio gear and related applications tend to call for digital audio files with 44.1 kHz or 48 kHz sample rates, higher sample rates can be useful in audio recording applications where effects are applied to ensure that the modified source information is as close to the original analog signal, e.g., the signal generated by pressure on a microphone diaphragm, as possible.

Accordingly, in one or more embodiments the first digital audio workstation 608 will adjust the effective sample rate of the digital audio file to a predefined rate by changing the metadata. This is different from resampling. By changing the metadata, audio equipment processing the file believes the file to be recorded at one sample rate, i.e., by reading the metadata, when the file was actually recorded at a different sample rate. Accordingly, when the equipment processes that file, the audio characteristics will change from their original form. For example, the song might sound faster and at a higher pitch, or alternatively slower and at a lower pitch.

Illustrating example, if the digital audio file 604 has associated therewith a sample rate of 192 kHz, as indicated by the metadata, and a sample rate of 44.1 kHz is desired, the metadata can be changed to make equipment believe that the digital audio file 604 was recorded at 44.1 kHz and not 192 kHz. When the equipment processes the digital audio file 604, it will therefore sound slower and lower. Thus, the effective sample rate can be adjusted to this lower rate by altering the metadata associated with the file, which alters the speed of playback. Similarly, if the digital audio file 604 has a sample rate of 88.2 kHz, and a sample rate of 192 kHz is desired, the first digital audio workstation 608 can convert the effective sample rate to the higher rate by changing the metadata in similar fashion. Adjusting metadata 617 is preferable to resampling at a different sample rate because the latter generally can lead to fidelity loss and are avoided by audio professionals if possible.

Additionally, in other embodiments, prior to applying the dynamic analog modification 681 to the analog signal 619, the first digital audio workstation 608 can change the clock frequency associated with the digital audio file 604. Illustrating by example, the digital audio file 11 may have metadata 617 indicating a clock frequency that should be used for normal playback to preserve the proper frequency characteristics of the music represented by the digital audio file 604. For instance, the metadata 617 may indicate a sample rate of 44.1 kHz. In one embodiment, the sample rate may also be the clock frequency that should be used for normal playback to preserve the proper frequency characteristics of the music represented by the digital audio file 604.

Even where the metadata 617 does not indicate the clock frequency, the sample rate can be extrapolated into a clock frequency to use for normal playback. For instance, because each sample of the digital audio file 604 contains multiple bits-worth of information, if the audio processing system 100 ties the clock to a particular amount of data to be processed, the actual clock frequency for playback may also depend on the bit rate, which also may be indicated by metadata 617 in the digital audio file 604. However, the sample rate indicated by metadata 617 in many systems indicates the actual clock frequency for normal playback, eliminating the need for the processor to calculate a different clock frequency for use in playback. However, either embodiment is considered to indicate a first clock frequency for a processor to use for normal playback.

In one or more embodiments, when the first digital audio workstation 608 begins to convert the digital audio file 604 with the digital-to-analog converter 618, it does so by routing informational chunks of the digital audio file 604 at a specified playback clock frequency, which may or may not be equal to the sample rate. The digital-to-analog converter then converts the informational chunks into an analog signal 619.

In one or more embodiments, the first digital audio workstation 608 may cause the digital audio file 604 to play at a second clock frequency that is different from the first clock frequency that should be used for normal playback to preserve the proper frequency characteristics of the music represented by the digital audio file 604. The second clock frequency can be higher or lower than the first clock frequency. However, in one or more embodiments the second clock frequency is greater than the first clock frequency. Illustrating by example, in one or more embodiments the first digital audio workstation 608 may set the metadata 617 of the digital audio file 604 to indicate a second clock frequency for playback that is double the first clock frequency. However, other combinations are possible, such as a 25 percent higher clock frequency.

Using the second clock frequency for playback that is higher than the normal clock frequency causes the digital audio file 604 to playback at a faster speed than normal. As a result, the digital audio file 604 exhibits higher frequency characteristics than when played at the normal playback frequency. It also completes playback more quickly. By doubling the clock frequency, a digital audio file with audio information up to 22,500 Hz can have audio information up to 44,100 KHz, which is far outside the range of human hearing.

In one embodiment, the second clock frequency is chosen to substantially reduce or virtually eliminate audio frequency information below 250 Hz. This low frequency information often creates a "muddy" sound and may be the cause of distortion created by digital-to-analog converters and/or analog components, such as a compressor, or digital components, such as digital audio processors. The exact clock frequency needed to raise the low frequency information above this threshold may vary depending on the source audio information. For example, if an audio file has substantial audio information at 200 Hz, a 25 percent increase in clock frequency will move that audio information to above 250 Hz. In one embodiment, the ideal clock frequency is chosen automatically by the processor, which analyzes the digital audio file to determine which clock frequency will move audible levels of audio information to above 100 Hz.

In one embodiment, the digital-to-analog converter 618 converts the digital audio into an analog audio signal while the digital audio is playing at the higher second clock frequency. Because the first digital audio workstation plays the digital audio file 604 at the higher second clock frequency, less low frequency information is passed through the converters. This reduces distortion and allows for a louder analog audio signal. Eliminating and/or reducing low frequency information also lightens the load on these components, including the analog input of the analog-to-digital converter 624, in which low-frequency information can account for significant portions of current, causing overloading and/or distortion. This results in a clearer analog signal 619.

The analog signal 619, as a result, may require less compression since it is already louder. This, in turn, also allows for maintaining dynamics in volume while still achieving commercial loudness levels. This further leads to more clarity in the digital-to-analog conversion, since lower frequencies are often the cause of the most audible distortion during the conversion process.

The clock signal used to play the digital audio file 604 at the higher second clock frequency may be generated by the first digital audio workstation 608 in one embodiment. Alternatively, a module communicatively coupled to the digital audio file 604 may be responsible for generating the clock signal in another embodiment. For example, a separate clock module may be used to reduce an effect called jitter by having the clock module supply the digital audio workstation 608 with a more accurate clock signal. Other modules, such as the digital-to-analog converter 618, may alternatively supply the clock signal to the processor.

Although the sample rate can be changed in metadata 617 to reflect the second clock frequency in one embodiment, an alternate embodiment does not alter the metadata 617. Instead, the digital audio workstation 608 may notify an external converter of the playback clock frequency to use. Or the user may select the clock frequency using the user interface 610. The external converter may not check the metadata 617 of the digital audio file, but instead will supply the clock at the frequency indicated by the digital audio workstation 608 or user. In this embodiment, after the audio has been processed, the resulting modified digital audio file may already contain the correct metadata 617 for sample rate. However, in one embodiment, the external converter must be notified to change the clock frequency back to the first frequency for normal playback.

Where changed playback frequencies are employed, once the modified analog signal 623 is output from the last effects module, the modified analog signal 623 is converted back into a modified digital audio file 625 through use of an analog-to-digital converter 624. In one or more embodiments, this conversion occurs without changing the speed of the modified digital audio file 625. In other words, the converted file initially may be set to play at the second clock frequency.

In an alternate embodiment, the analog-to-digital converter 624 may be set to change the playback clock frequency of the modified analog signal 623 as compared to the original digital audio file 604 without modifying the metadata 617. In this instance, the playback clock frequency supplied, e.g., using a crystal oscillator, by the analog-to-digital converter 624 may be changed accordingly to cause the modified digital audio file 625 to play at the same speed as the original digital audio file 604 with the second playback frequency. In one such embodiment, the external converter may not know the contents of the metadata 617 at any point in the process. In this way, no changes to the sample rate specified in metadata 617 occur in one embodiment.

Once the second digital audio file has been stored at the second digital audio workstation 609, or alternatively in the server 607, in one embodiment the metadata 617 of the modified digital audio file 625 can be changed to indicate the first clock frequency for normal playback speed. This effectively restores the frequency response of the modified digital audio file 625 heard when played, eliminating any "chipmunk effect" caused by setting the playback frequency to the second frequency prior to dynamic enhancement.

Turning now to FIG. 7, illustrated therein is an alternate audio processing system 700 configured in accordance with one or more embodiments of the disclosure. The audio processing system 700 of FIG. 6 is operable with a client device (601), just as was the audio processing system (600) of FIG. 6. The client device (601) can be in communication with a server complex 702 across a network (603). Here, the server complex 702 is shown separated into a digital domain 741 and an analog domain 742. As before, the client device (601) accesses a user interface (610) of the audio processing system 700, which allows a user to control one or more analog signal processors 705 remotely, across the network (603), to master a digital audio file 704 in the analog domain.

In this illustrative embodiment, the server complex 702 has a single digital audio workstation 708 that functions both as an audio workstation and a server. The digital audio workstation 708 is operable with the one or more analog signal processors 705. The server complex 702 provides users with access to the mastering components, e.g., the digital audio workstation 708 and the one or more analog signal processors 705 across the network (603). As before, the user interface (610) is operable to receive one or more analog domain control settings 711 that are used to control the one or more analog signal processors 705 and/or the digital audio workstation 708.

The server complex 702 then receives the digital audio file 704 and the one or more analog domain control settings 711 from the client device (601) across the network (603). The digital audio file 704 may also contain metadata (617) as previously described.

The digital audio workstation 708 comprises a digital-to-analog converter 718 and an analog-to-digital converter 724. The digital-to-analog converter 718 receives the digital audio file 704 and converts the digital audio file 704 to an analog signal 719. The digital-to-analog converter 718 then sends the analog signal 719 to the one or more analog signal processors 705,606 for processing.

A control device 720 is operable to control the one or more analog signal processors 705. The control device 720 receives the one or more analog domain control settings 711 from the digital audio workstation 708 and applies them to the one or more analog signal processors 705. The control device can adjust the knobs, sliders, and other controls of the mixing consoles to apply setting adjustments to configure the one or more analog signal processors 705 in accordance with the one or more analog domain control settings 711.

The one or more analog signal processors 705, receive the analog signal 719 from the digital-to-analog converter 718 and apply at least one dynamic analog modification to the analog signal 719 in accordance with the one or more analog domain control settings 711 to obtain modified analog signal 722. The dynamic modifications or effects applied by the one or more analog signal processors 705 may include at least one of compression, limiting, equalization, or combinations thereof.

One or more hardware modules 721,722,723 apply the compression, limiting, equalization, or combinations thereof. A compressor module 721 may output a modified analog signal that is received as an input at a limiter module 722. The output of limiter module 722 may then be received as an input of equalization module 723.

The compressor module 721 is used to compress the dynamic range of the analog signal 719. The limiter module 722 may receive a modified analog signal from compressor module 721. The equalization module 723 then applies equalization to the analog signal 719.

After the one or more analog signal processors 705,606 apply the dynamic analog modification(s) to the analog signal 719 in accordance with the one or more analog domain control settings 711, the analog-to-digital converter 724 converts the modified analog signal 723 into a modified digital audio file as previously described. The server complex 702 can present a network download portal (626) that allows a user to download the modified digital audio file across the network (603). Accordingly without ever visiting the server complex 702 or its associated studio, the user is able to master the digital audio file 704, using their own prescribed settings for the one or more analog signal processors 705. Prior art systems are simply unable to allow such remote control of analog components.

Figure 8:
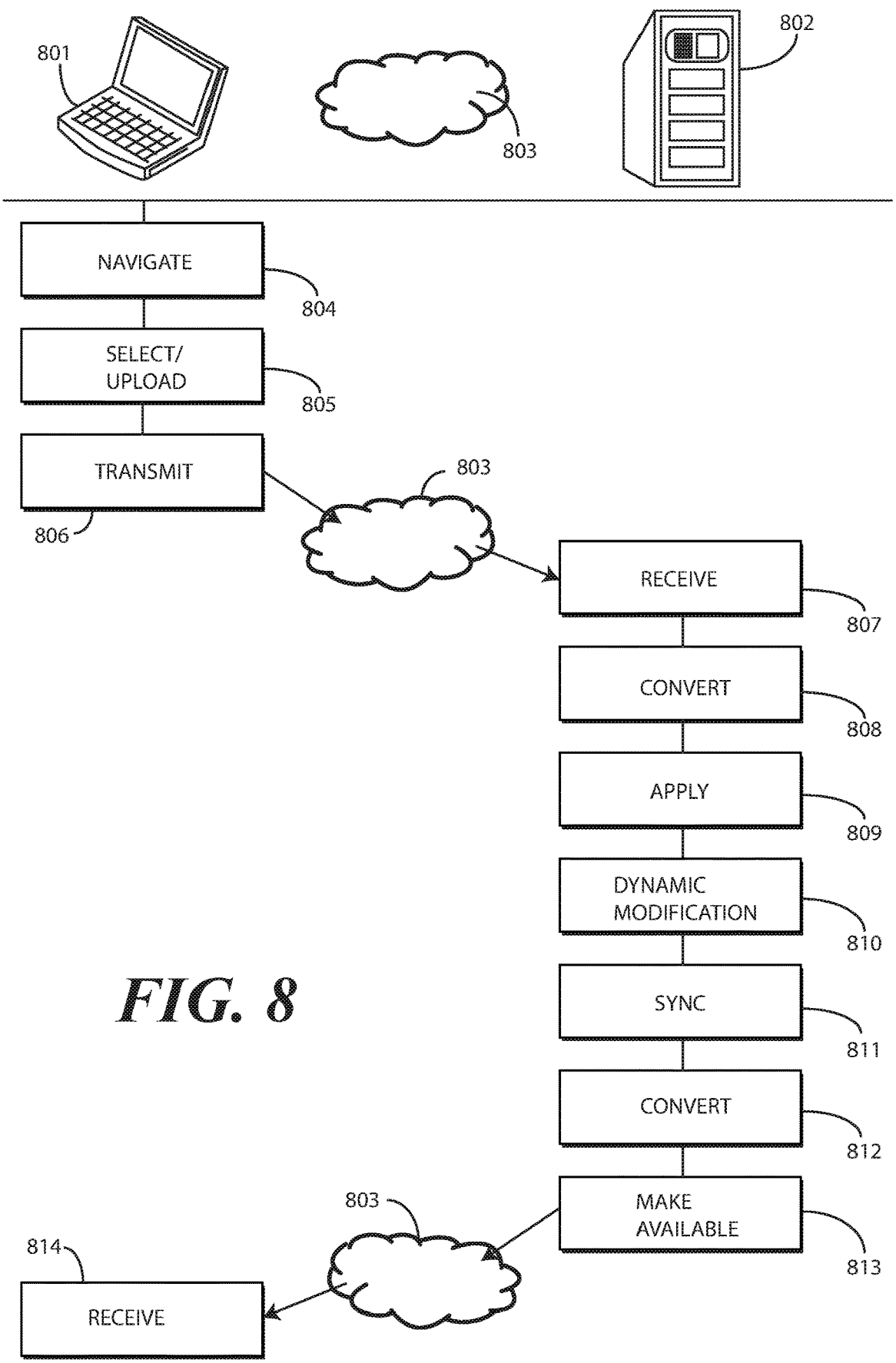
FIG. 8 illustrates one explanatory method and system in accordance with one or more embodiments of the disclosure.

Turning now to FIG. 8, illustrated therein is a system level diagram of one explanatory audio processing system 800 configured in accordance with one or more embodiments of the disclosure. As shown in FIG. 8, a remote electronic device 801 is in communication with a server complex 802 across a network 803. The remote electronic device 801 can be considered to be an "off host" computer in that it is separated from the host, i.e., the server complex 802 in this embodiment, by the network 803. In one or more embodiments, the network 803 comprises the Internet. However, other networks could be substituted for the Internet. For example, the network 803 can comprise a wide area network, local area network, ad hoc network, or other network. Still other networks will be obvious to those of ordinary skill in the art having the benefit of this disclosure.

At step 804, the remote electronic device 801 navigates to a user interface, which in one embodiment is a web portal. In one or more embodiments, the user interface includes a network upload portal receiving an upload of the digital audio file through the network upload portal At step 805, the remote electronic device 801 uses the user interface to select one or more analog domain control settings and to attach a digital audio file. The analog domain control settings could be selected via a preset selector. For instance, in the embodiment of FIG. 6 above one or more analog domain control settings were selected via a plurality of loudness indicators, each of which corresponds to one or more preset levels and controls of analog signal processing equipment.

The one or more analog domain control settings could be selected in other ways as well. For example, as will be described below with reference to FIG. 11, sliders or other level adjusters can be used to select the one or more analog domain control settings. As will be described with reference to FIG. 12, the one or more analog domain control settings could be created using a virtual representation of the studio, including a mixing console or other representation of the analog signal processors. Still other techniques for entering the analog domain control settings will be obvious to those of ordinary skill in the art having the benefit of this disclosure. In one or more embodiments, the one or more analog domain control settings created at step 805 are converted to a format convenient for transmission across the network 803, such as via an Extensible Markup Language (XML) file.

At step 806, the remote electronic device 801 transmits the digital audio file and the one or more analog domain control settings across the network 803 to the server complex 802. In one or more embodiments, the digital audio file and/or the one or more analog domain control settings may be transmitted and/or stored on one or more intermediate servers during this process. For example, one or more "cloud" servers may store the digital audio file and/or the one or more analog domain control settings so that they are accessible by both the server complex 802 and the remote electronic device 801.

At step 807, the serve complex receives the digital audio file and the one or more analog domain control settings from the remote electronic device 801 across the network 803. At step 808, a digital-to-analog converter at the server complex 802 receives the digital audio file and converts the digital audio file to an analog signal. At step 809, a control device operable with one or more analog signal processors at the server complex 802 applies setting adjustments to the one or more analog signal processors in accordance with the one or more analog domain control settings received from the remote electronic device 801. Examples of control devices include robotic arms, digitally controlled relays, voltage controlled filters, digitally controlled servo-driven potentiometers, digitally controlled servo-driven attenuators, digitally controlled voltage controlled amplifiers, or digitally controlled variable gain amplifiers. Still other techniques for mechanically controlling the potentiometers, sliders, levers, and other controls of a mixing console or other control mechanism for analog signal processing circuits will be obvious to those of ordinary skill in the art.

At step 810, the one or more analog signal processors receive the analog signal from the digital-to-analog converter and apply at least one dynamic analog modification to the analog signal. In one or more embodiments, this modification occurs in accordance with the one or more analog domain control settings received from the remote electronic device 801 due to the control device applying the setting adjustments of the previous paragraph. When the analog signal processors apply the one or more dynamic analog modifications to the analog signal, this creates a modified analog audio signal. The dynamic analog modifications can include one or more of compression, limiting, or equalization. Other dynamic analog modifications will be obvious to those of ordinary skill in the art having the benefit of this disclosure.

At optional step 811, where the server complex 802 includes multiple digital audio workstations, the server complex 802 can optionally synchronize delivery of the analog signal to the one or more analog processors and the conversion of the analog signal to the modified digital audio file. At step 812, an analog-to-digital converter of the server complex 802 converts the modified analog audio signal to a modified digital audio file. This optional step 812 can include initiation of a conversion of the digital audio file to the analog signal at the first digital audio workstation to deliver the analog signal to the one or more analog signal processors and conversion of the analog signal at the second digital audio workstation to a second digital audio file after the application of the at least one dynamic analog modification.

In one or more embodiments, the server complex 802 can make electronic audio signals available to the remote electronic device 801 during any of steps 807-812. Accordingly, a user at the remote electronic device 801 can listen to the manipulation of the audio corresponding to any of the digital audio file, the analog audio signal, and/or the modified digital audio file in real time. Said differently, a user at the remote electronic device 801 can aurally monitor the mastering process, as it occurs, in real time.

At step 813, the server complex 802 makes the modified digital audio file available to the remote electronic device 801. This can be done in any of a number of ways. In the simplest embodiment, the server complex 802 simply transmits the modified digital audio device to the remote electronic device 801 across the network 803. In another embodiment, the server complex 802 delivers the modified digital analog file to a cloud server that is accessible by the remote electronic device 801 and from which the remote electronic device 801 can download the modified digital audio file.

In still another embodiment, the server complex 802 makes a network download portal available to the remote electronic device 801. The network download portal facilitates download of the modified digital audio file. For example, in one embodiment the server complex 802 can email a link to the remote electronic device 801. Clicking on the link initiates download of the modified digital audio file to the remote electronic device 801 from the server complex. Still other mechanisms for making the modified digital audio file available to the remote computer will be obvious to those of ordinary skill in the art having the benefit of this disclosure.

At step 814, the remote electronic device 801 receives the modified digital audio file. Using the audio processing system 800, the remote electronic device 801 has been able to remotely control analog signal processing circuitry to perform true, high fidelity, analog mastering on an uploaded digital audio file.

Figure 9:
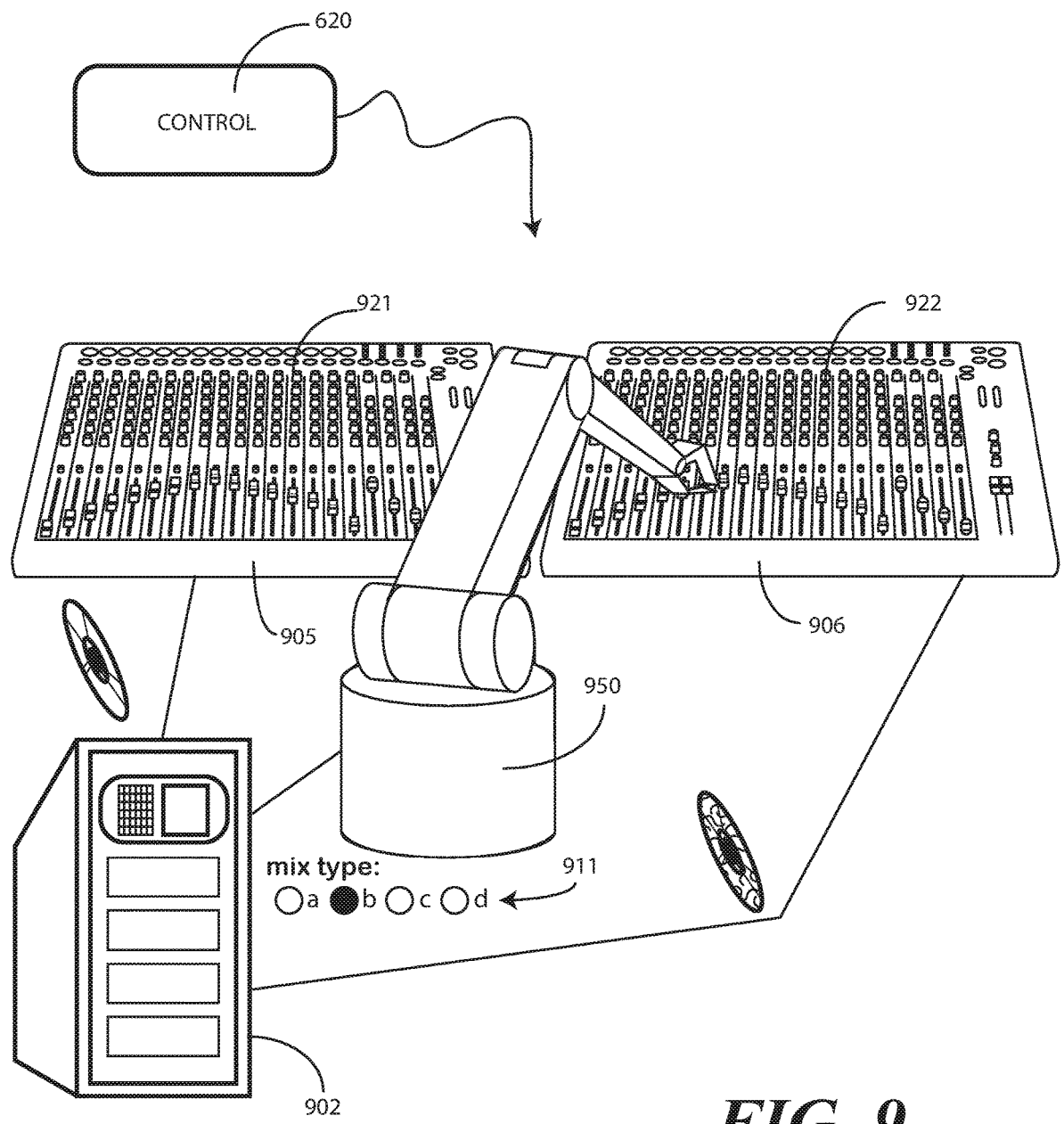
FIG. 9 illustrates one explanatory control device controlling one or more analog signal processors in accordance with one or more embodiments of the disclosure.
Figure 10:
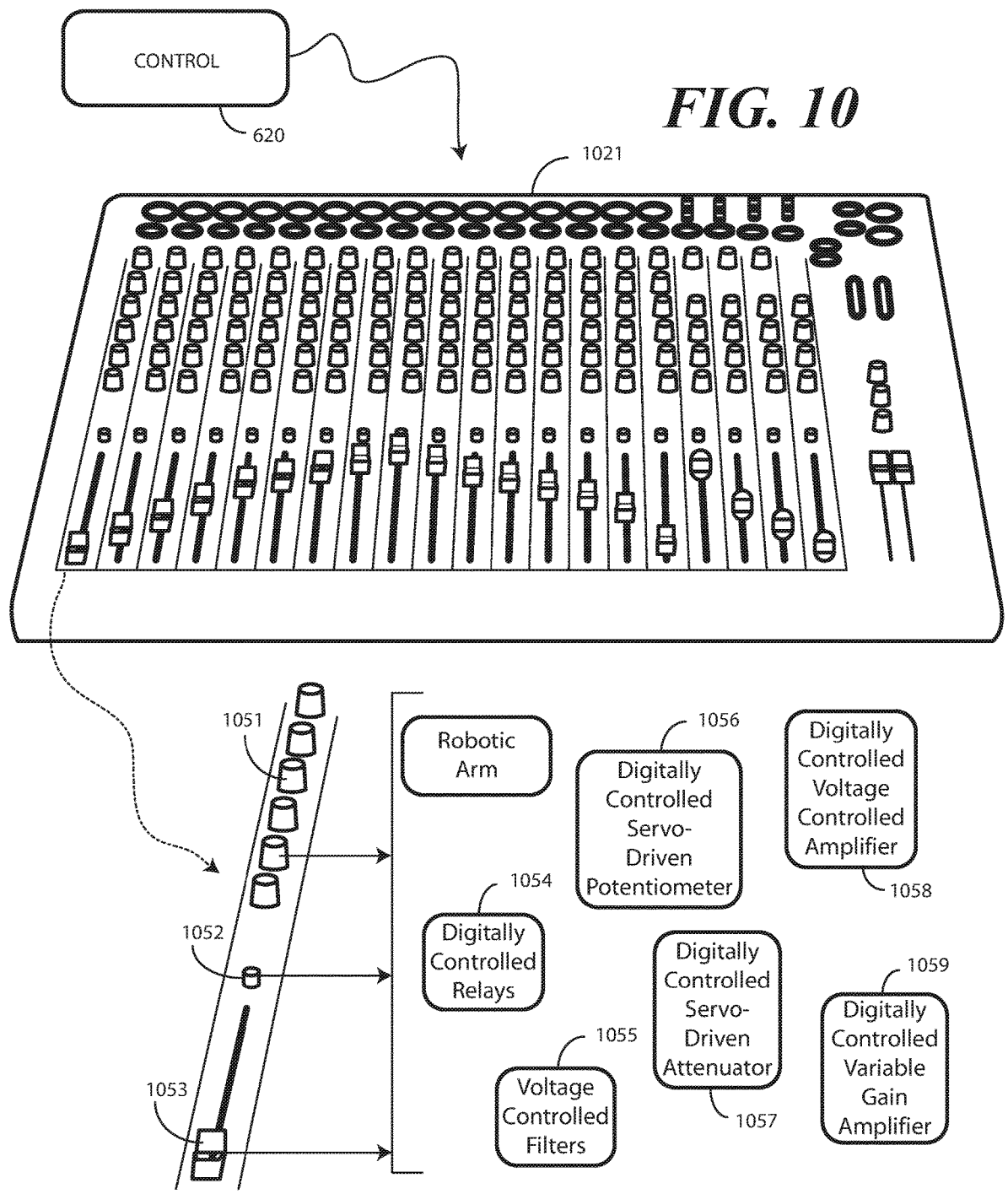
FIG. 10 illustrates additional explanatory control devices controlling one or more analog signal processors in accordance with one or more embodiments of the disclosure.

Turning now to FIGS. 9 and 10, illustrated therein are different control devices 620 suitable for use with one or more embodiments of the disclosure. Beginning with FIG. 9, illustrated therein is a server complex 902 operable with one or more analog signal processors 905,906 being controlled by mixing consoles 921,922. The mixing consoles 921,922, also known as mixing boards, the boards, the dang boards, the sound boards, or the audio mixers, allow knobs, sliders, switches, and other potentiometer-like devices to control signal levels, frequency content, dynamics, and other effects of the one or more analog signal processors 905,906. A mastering engineer adjusts these controls with their fingers while listening critically to the audio signals. However, with embodiments of the disclosure, a remote device controls the same with analog domain control settings.

The question thus becomes how to control mechanical devices with digital information. In this illustrative embodiment, a robotic arm 950 receives the analog domain control settings 411 and makes the necessary adjustments to the mixing consoles 921,922. Thus, a user can control the mixing consoles 921,922 remotely with just a few clicks of the mouse. Advantageously, they can become mastering engineers taking advantage of the expensive analog equipment of a mastering studio without having to travel to the studio. The robotic arm 950 essentially becomes a remote extension of their arm to make analog masters.

A robotic arm 950, while extremely effective, is not the only way to control the controls of the mixing consoles 921,922. Turning now to FIG. 10, illustrated therein are various other ways to control the knobs 1051, sliders 1052, and switches 1053 of a mixing console 1021.

In one embodiment, the control device 620 comprises one or more digitally controlled relays 1054. In another embodiment, the control device 620 can comprise one or more voltage-controlled filters 1055. In yet another embodiment, the control device 620 comprises one or more digitally controlled servo-driven potentiometers 1056. In still another embodiment, the control device 620 comprises one or more digitally controlled servo-driven attenuators 1057. In still another embodiment, the control device 620 comprises one or more digitally controlled voltage controlled amplifiers 1058. In yet another embodiment, the control device 620 comprises one or more digitally controlled variable gain amplifiers 1059. Each of these devices is able to receive a digital input and convert that digital input into analog, mechanical action, e.g., turning knobs 1051, translating sliders 1052, toggling switches 1053, and making other adjustments to the mixing console 1021. Moreover, these various control devices can be used in combination as well. Still other control devices will be obvious to those of ordinary skill in the art having the benefit of this disclosure.

Figure 11:
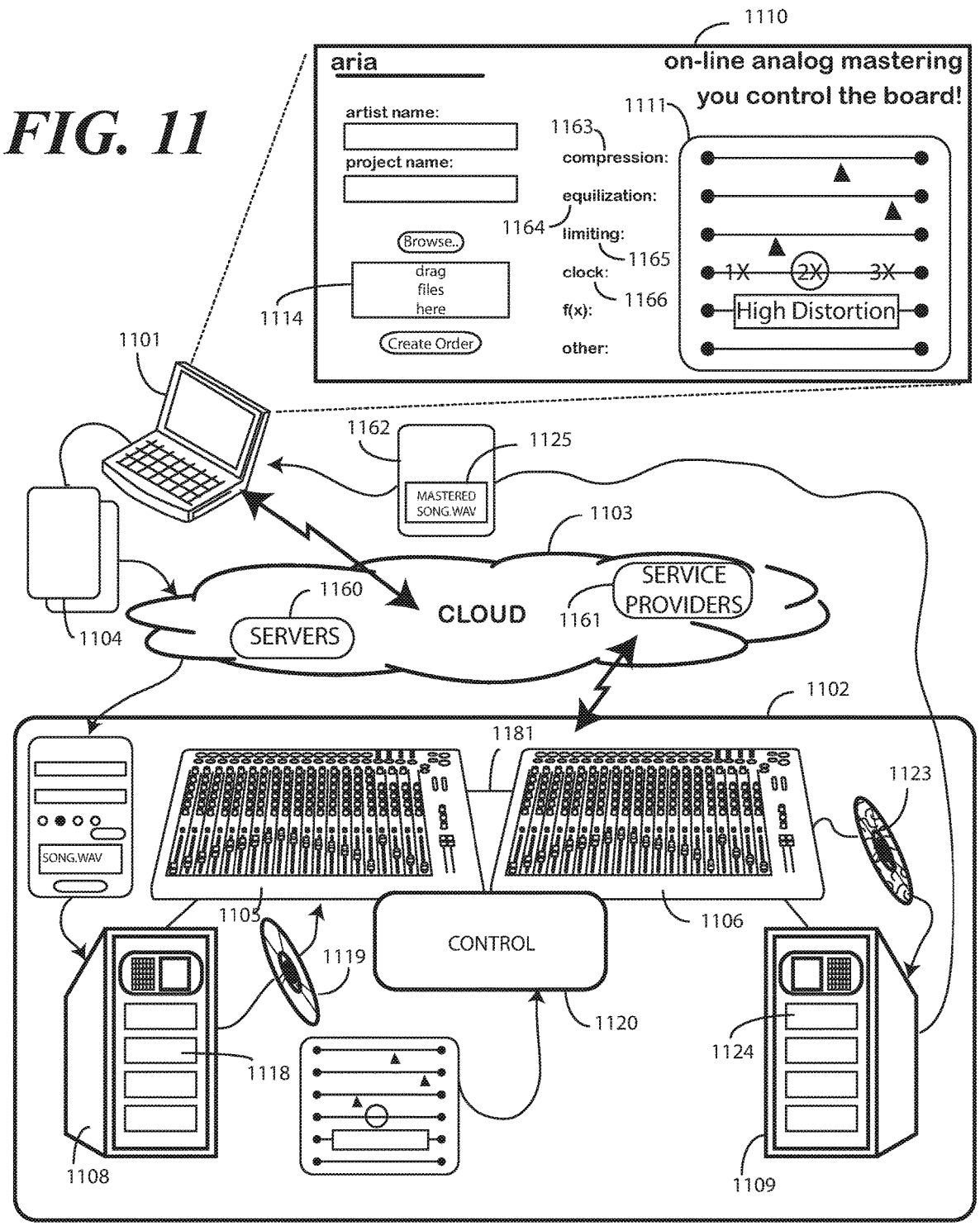
FIG. 11 illustrates another explanatory system in accordance with one or more embodiments of the disclosure.
Figure 12:
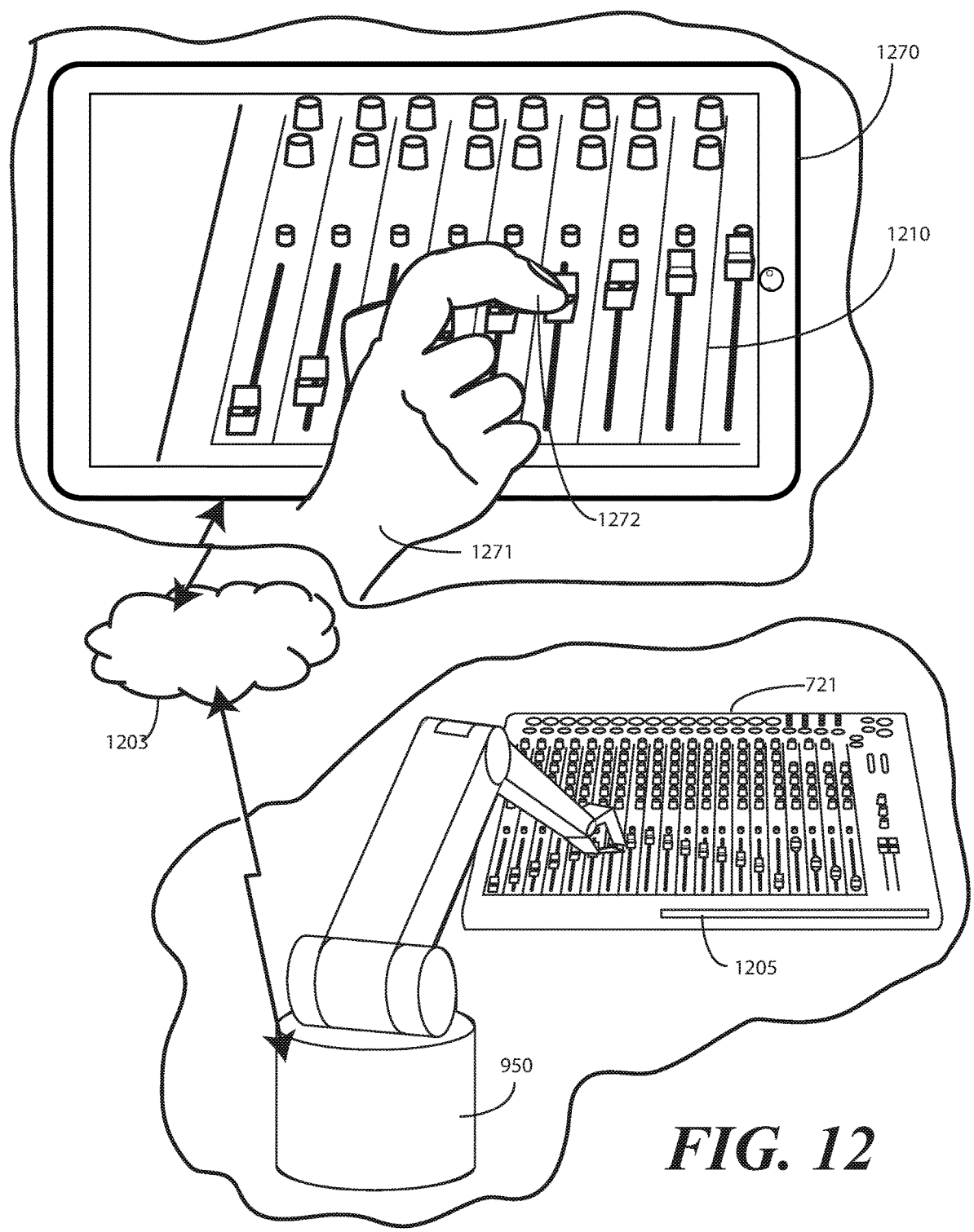
FIG. 12 illustrates another explanatory system in accordance with one or more embodiments of the disclosure.

Turning now to FIG. 11, illustrated therein is another audio processing system 1100 configured in accordance with one or more embodiments of the disclosure. The audio processing system 1100 comprises a client device 1101 in communication with a server complex 1102 across a network 1103. In this illustrative embodiment, the network 1103 comprises "the cloud."

The cloud, which represents one or more networked servers 1160 or network-based service providers 1161, can provide one or more computing services that are available to one or both of the client device 1101 or the server complex 1102. Illustrating by example, the one or more networked servers 1160 can include a collection of computing devices, which can be located centrally or distributed, that provide cloud-based services to one or both of the client device 1101 or the server complex 1102 via a network 1103 such as the Internet. The cloud can be used, for instance, by the server complex 1102 or the client device 1101 to offload various computing tasks such as processing user input, presenting user interfaces, storing data, and so forth.

The cloud can, for example, provide services such as the presentation of the user interface 1110, the provision of the network upload portal 1114, the client download portal 1181, storage of the digital audio file 1104, the modified digital audio file 1125, or the one or more analog domain control settings 1111. Service providers 1161 can customize the screen size, display capability, file storage options, messaging, communications between the client device 1101 and the server complex 1102, or other services. Still other uses for the cloud and its corresponding networked servers 1160 or services providers 1161 will be obvious to those of ordinary skill in the art having the benefit of this disclosure.

The client device 1101 initially accesses the user interface 1110. In one or more embodiments, the user interface 1110 is operable to receive one or more analog domain control settings 1111 that are used to control the one or more analog signal processors 1105,1106 and/or the first digital audio workstation 1108 and (where included) the second digital audio workstation 1109.

In this illustrative embodiment, the one or more analog domain control settings 1111 comprise a plurality of sliders by which the desired amount of compression 1163, equalization 1164, limiting 1165, or other parameters can be controlled. Additionally, adjusters for clock frequency 1166 can be included to clock the digital audio file 1104 at a higher frequency while applying analog signal modifications as previously described can be provided as well.

In one or more embodiments, the user interface 1110 is also operable to receive the digital audio file 1104. In this illustrative embodiment, the user interface 1110 also comprises a network upload portal 1114 through which the server complex 1102 can receive an upload of the digital audio file 1104 through the network upload portal 1114. In one or more embodiments, the digital audio file 1104 is stored on a networked server 1160 in the cloud so that it is accessible by both the client device 1101 and the server complex 1102.

The server complex 1102 downloads the digital audio file 1104 and the one or more analog domain control settings 1111 form the networked servers 1160 of the cloud. A digital-to-analog converter 1118 converts the digital audio file 1104 to an analog signal 1119. A control device 1120 receives the one or more analog domain control settings v11 and applies them to the one or more analog signal processors 1105,1106. Once the digital audio file 1104 is converted to the analog signal 1119, the one or more analog signal processors 1105,1106 apply at least one dynamic analog modification 1121 to the analog signal 1119 in accordance with the one or more analog domain control settings 1111. The dynamic modifications or effects applied by the one or more analog signal processors 1105,1106 may include at least one of compression, limiting, and equalization.

After the one or more analog signal processors 1105,1106 apply the dynamic analog modification(s) to the analog signal 1119 in accordance with the one or more analog domain control settings 1111, an analog-to-digital converter 1124 converts the modified analog signal 1123 into a modified digital audio file 1125. In one embodiment, the server complex 1102 then uploads the modified digital audio file 1125 to one of the networked servers 1160 in the cloud for retrieval by the client device 1101.

While two explanatory user interfaces have been described above with reference to FIGS. 6 and 11, it should be noted that numerous others can be used in accordance with one or more embodiments of the disclosure. For example, turning to FIG. 12, in this embodiment another user interface 1210 is being presented on a tablet computer 1270. In this illustrative embodiment, the user interface 1210 comprises a virtual presentation of the mixing consoles 1221 used to control the analog signal processors 1205. Accordingly, a user 1271 can pan across the mixing console 1221 with their finger 1272 making adjustments to the various knobs, switches, and sliders of the mixing console 1221 to deliver the analog domain control settings to the mixing console 1221 through the robotic arm 950. This user interface 1110 allows the user 1271 to control the analog signal processors 1205 just as if he were in the studio, but while being remotely located across a network 1203. Other user interfaces will be obvious to those of ordinary skill in the art having the benefit of this disclosure.

Figure 13:
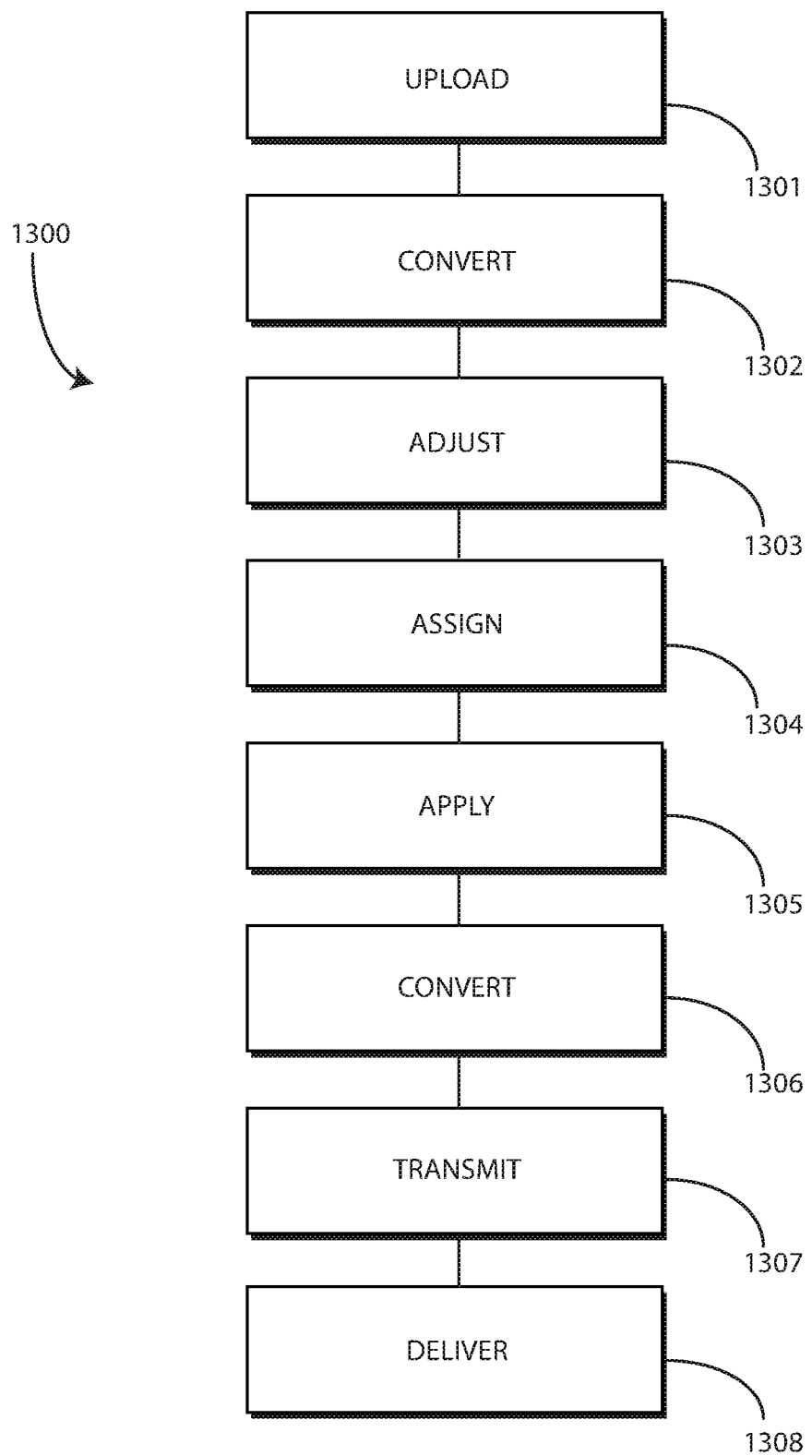
FIG. 13 illustrates one explanatory method in accordance with one or more embodiments of the disclosure.

Turning now to FIG. 13, illustrated therein is one explanatory method 1300 configured in accordance with one or more embodiments of the disclosure. At step 1301, the method 1300 includes receiving, with a server complex in communication with a network, a digital audio file and one or more analog domain control settings. In one or more embodiments, this step 1301 includes uploading, with the server complex, the digital audio file and the one or more analog domain control settings from a remote device across the network. For example, the remote device can upload the digital audio file to a cloud computer, from which the server complex can download the same.

At step 1302, the method 1300 includes converting, with a digital to analog converter, the digital audio file to an analog signal. At step 1303, the method 1300 includes adjusting one or more analog signal processors in accordance with the one or more analog domain control settings. At step optional step 1304, the method 1300 includes assigning, with the server complex, a clock frequency to the digital audio file that is different from a playback frequency used for normal playback as previously described.

At step 1305, the method 1300 includes applying, with the one or more analog signal processors, at least one dynamic analog modification to the analog signal. At step 1306, the method 1300 includes converting, with an analog to digital converter, the analog signal to a second digital audio file.

At optional step 1307, the method 1300 can include transmitting, with the server complex across the network, one or more messages identifying a mastering status of one or more of the digital audio file or the second digital audio file. For example, the method 800 may include sending one or more email messages, text messages, or other communications to the remote device to let a user know what step of the mastering process their song is presently occurring.

At step 1308, the method 1300 includes delivering the second digital audio file to a remote device across the network. In one or more embodiments, this includes storing the second digital audio file with a cloud computer so that the remote device can download the same.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure.

What is claimed is:

1. An audio processing system, comprising:
    a server complex in communication with a network, the server complex receiving a digital audio file and one or more analog domain control settings from a remote device across the network;
    a digital-to-analog converter receiving the digital audio file from the server complex and converting the digital audio file to an analog signal;
    one or more analog signal processors receiving the analog signal from the digital-to-analog converter;
    a robotic arm operable with the one or more analog signal processors, the robotic arm applying setting adjustments to the one or more analog signal processors in accordance with the one or more analog domain control settings received from the remote device;
    the one or more signal processors applying at least one analog modification to the analog signal in accordance with the one or more analog domain control settings received from the remote device to the analog signal to obtain a modified analog signal; and
    an analog-to-digital converter converting the modified analog signal to a modified digital audio file.

2. The audio processing system of claim 1, the robotic arm applying the setting adjustments to the one or more analog signal processors by adjusting one or more of knobs, sliders, or potentiometers of the one or more analog signal processors in accordance with the one or more analog domain control settings received from the remote device.

3. The audio processing system of claim 1, the one or more analog signal processors comprising a mixing console, the robotic arm adjusting the mixing consoles in accordance with the one or more analog domain control settings received from the remote device.

4. The audio processing system of claim 1, the robotic arm increasing compression settings of the one or more analog signal processors.

5. The audio processing system of claim 1, the at least one analog modification comprising one or more of compression, limiting, or equalization.

6. The audio processing system of claim 1, further comprising a first digital audio workstation comprising the digital-to-analog converter, the first digital audio workstation receiving the digital audio file from the server complex.

7. The audio processing system of claim 6, further comprising a second digital audio workstation comprising the analog-to-digital converter.

8. The audio processing system of claim 7, the server complex further synchronizing delivery of the analog signal to the one or more analog signal processors and the conversion of the analog signal to the modified digital audio file.

9. The audio processing system of claim 8, the server complex causing a concurrent:
    initiation of a conversion of the digital audio file to the analog signal at the first digital audio workstation to deliver the analog signal to the one or more analog signal processors; and
    conversion of the analog signal at the second digital audio workstation to a second digital audio file after application of the at least one analog modification.

10. The audio processing system of claim 1, the server complex delivering a user interface for presentation on the remote device, the user interface receiving the one or more analog domain control settings.

11. The audio processing system of claim 10, the user interface comprising a loudness level selection tool defining a loudness level associated with the digital audio file.

12. The audio processing system of claim 10, the user interface comprising a virtual presentation of the one or more analog signal processors.

13. The audio processing system of claim 10, the user interface further comprising a network upload portal receiving an upload of the digital audio file through the network upload portal.

14. The audio processing system of claim 1, the server complex further comprising a network download portal facilitating download of the modified digital audio file across the network.

15. A method, comprising:
receiving, with a server complex in communication with a network, a digital audio file and one or more analog domain control settings;
converting, with a digital to analog converter, the digital audio file to an analog signal;
adjusting, with a robotic arm, one or more analog signal processors receiving the analog signal from the digital to analog converter in accordance with the one or more analog domain control settings;
applying, with the one or more analog signal processors, at least one analog modification to the analog signal; and
converting, with an analog to digital converter, the analog signal to a second digital audio file after the applying.

16. The method of claim 15, the receiving comprising uploading, with the server complex, the digital audio file and the one or more analog domain control settings from a remote device across the network.

17. The method of claim 16, further comprising delivering the second digital audio file to the remote device across the network.

18. The method of claim 17, further comprising transmitting, with the server complex across the network, one or more messages identifying a mastering status of one or more of the digital audio file or the second digital audio file.

19. The method of claim 17, further comprising assigning, with the server complex, a clock frequency to the digital audio file that is different from a playback frequency used for normal playback prior to the applying.

20. The method of claim 15, further comprising storing one or more of the digital audio file or the second digital audio file with a cloud computer.

* * * * *